(12) United States Patent
Saitoh et al.

(10) Patent No.: US 10,388,676 B2
(45) Date of Patent: Aug. 20, 2019

(54) ACTIVE MATRIX SUBSTRATE AND METHOD FOR PRODUCING SAME, AND IN-CELL TOUCH PANEL-TYPE DISPLAY DEVICE

(71) Applicant: SHARP KABUSHIKI KAISHA, Sakai, Osaka (JP)

(72) Inventors: Takao Saitoh, Sakai (JP); Yohsuke Kanzaki, Sakai (JP); Makoto Nakazawa, Sakai (JP); Kazuatsu Ito, Sakai (JP); Seiji Kaneko, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/743,369

(22) PCT Filed: Aug. 4, 2016

(86) PCT No.: PCT/JP2016/072970
§ 371 (c)(1),
(2) Date: Jan. 10, 2018

(87) PCT Pub. No.: WO2017/026372
PCT Pub. Date: Feb. 16, 2017

(65) Prior Publication Data
US 2018/0204853 A1   Jul. 19, 2018

(30) Foreign Application Priority Data
Aug. 10, 2015   (JP) .................................. 2015-158026

(51) Int. Cl.
G09G 3/36       (2006.01)
H01L 29/786   (2006.01)
(Continued)

(52) U.S. Cl.
CPC .......... *H01L 27/124* (2013.01); *G02F 1/1343* (2013.01); *G02F 1/1345* (2013.01);
(Continued)

(58) Field of Classification Search
CPC ... H01L 27/124; H01L 29/786; G09G 3/3648; G06F 3/0412
See application file for complete search history.

(56) References Cited

U.S. PATENT DOCUMENTS

2008/0024416 A1   1/2008   Onogi et al.
2009/0195511 A1*  8/2009   Cites ..................... G06F 3/0412
                                          345/173
(Continued)

FOREIGN PATENT DOCUMENTS

JP   2005-062761 A   3/2005
JP   2008-032899 A   2/2008
(Continued)

*Primary Examiner* — Kimberly N Rizkallah
*Assistant Examiner* — Gustavo G Ramallo
(74) *Attorney, Agent, or Firm* — ScienBiziP, P.C.

(57) ABSTRACT

An active matrix substrate (1001) includes a connecting portion (101). The connecting portion. (101) includes a lower conductive layer supported by a substrate; a first insulating layer formed so as to cover the lower conductive layer (2) and having a contact hole (6p) that exposes a part of the lower conductive layer (2); a bottom conductive film (4) that is disposed in the contact hole (6p) and covers at least a part of the exposed part of the lower conductive layer (2), the exposed part being exposed by the contact hole (6p); a second insulating layer (9) that is formed on the first insulating layer (6) and in the contact hole (6p), is in contact with the bottom conductive film (4) in the contact hole (6p), and has an opening (9p) that exposes a part of the bottom conductive film (4); and an upper conductive layer (8) that is disposed on the second insulating layer (9) and in the opening (9p) and is in contact with the bottom conductive (Continued)

film (4) in the opening (9p). The entire bottom conductive film (4) is located on the substrate side relative to the upper surface of the first insulating layer (6).

13 Claims, 11 Drawing Sheets

(51) Int. Cl.
| | |
|---|---|
| H01L 27/12 | (2006.01) |
| G02F 1/1343 | (2006.01) |
| G02F 1/1345 | (2006.01) |
| G02F 1/1368 | (2006.01) |
| G06F 3/044 | (2006.01) |
| H01L 21/768 | (2006.01) |
| G02F 1/1362 | (2006.01) |
| G06F 3/041 | (2006.01) |
| G02F 1/1333 | (2006.01) |

(52) U.S. Cl.
CPC ...... *G02F 1/1368* (2013.01); *G02F 1/136286* (2013.01); *G06F 3/044* (2013.01); *G06F 3/0412* (2013.01); *G09G 3/3648* (2013.01); *H01L 21/768* (2013.01); *H01L 29/786* (2013.01); *G02F 1/13338* (2013.01); *G02F 1/136227* (2013.01); *G02F 2001/134372* (2013.01); *G02F 2201/121* (2013.01); *G02F 2201/123* (2013.01)

(56) References Cited

U.S. PATENT DOCUMENTS

| | | | |
|---|---|---|---|
| 2011/0025969 A1* | 2/2011 | Chen | G02F 1/13338 349/139 |
| 2014/0103365 A1 | 4/2014 | Fujimoto et al. | |
| 2014/0347590 A1* | 11/2014 | Fujita | G02F 1/1368 349/43 |
| 2016/0253030 A1 | 9/2016 | Tada et al. | |
| 2017/0069667 A1* | 3/2017 | Chen | H01L 27/1443 |

FOREIGN PATENT DOCUMENTS

| | | |
|---|---|---|
| JP | 2014-082246 A | 5/2014 |
| WO | 2013/105537 A1 | 7/2013 |
| WO | 2015/059995 A1 | 4/2015 |

* cited by examiner (a)

(b)

(a)

(b)

(c)

(d)

(e)

(a)

(b)

(c)

(a)

(b)

ACTIVE MATRIX SUBSTRATE AND METHOD FOR PRODUCING SAME, AND IN-CELL TOUCH PANEL-TYPE DISPLAY DEVICE

TECHNICAL FIELD

The present invention relates to an active matrix substrate and a method for producing the active matrix substrate.

BACKGROUND ART

Display devices including active matrix substrates in each of which a switching element is provided for each pixel are in wide use. Active matrix substrates including thin film transistors (hereinafter referred to as "TFTs") as switching elements are called TFT substrates. In this description, portions of a TFT substrate that correspond to pixels of a display device may also be referred to as pixels. Using an oxide semiconductor, instead of amorphous silicon or polycrystalline silicon, as a material for an active layer of a TFT is also proposed.

An active matrix substrate typically includes a TFT, a pixel electrode, a source wire connected to a source electrode of the TFT, and a gate wire connected to a gate electrode of the TFT. When such an active matrix substrate is used in a display device having a touch sensor function (hereinafter referred to as an "in-cell touch panel display device"), the active matrix substrate may be provided with a detection electrode of a touch sensor (e.g., PTL 1).

The active matrix substrate is also provided with a pixel contact portion that connects the pixel electrode and a drain electrode of the TFT to each other, a terminal portion for connecting the source or gate wire and an external wire to each other, etc. In this description, portions that connect two conductive layers together, such as the pixel contact portion and the terminal portion, are collectively referred to as "connecting portions".

In such a connecting portion, for example, an upper conductive film is disposed so as to be in contact with a lower conductive film in a contact hole formed in an insulating layer. For example, PTL 2 discloses a pixel contact portion having such a connection structure. This structure is disadvantageous in that when the contact hole is deep, the upper conductive film may provide low coverage to cause breaking.

FIG. 13 is a schematic sectional view illustrating a connecting portion that has undergone breaking. An upper conductive film 98 is disposed so as to be in contact with a lower conductive film 92 in a contact hole 96p formed in an insulating layer 96. The upper conductive film 98 tends to be thinner on the side wall of the contact hole 96p than in the vicinity of an opening of the contact hole 96p. Thus, depending on the depth and the shape of the contact hole 96p, breaking of the upper conductive film 98 may occur on the side wall of the contact hole 96p, as shown in the figure, resulting in electrical disconnection with the lower conductive film 92 or higher contact resistance.

PTL 3 proposes forming a conductive material film on the side wall of a contact hole by an etch back process in order to suppress the increase in contact resistance. An upper conductive film is disposed so as to be in contact with the conductive material film on the side wall of the contact hole and with a lower conductive film at the bottom of the contact hole.

CITATION LIST

Patent Literature

PTL 1: International Publication No. 2015/059995
PTL 2: Japanese Unexamined Patent Application Publication No. 2008-32899
PTL 3: Japanese Unexamined Patent Application Publication No. 2005-62761

SUMMARY OF INVENTION

Technical Problem

An investigation by the present inventors showed that the connecting portion proposed in PTL 3 cannot sufficiently improve the coverage of the upper conductive film and may fail to provide good contact properties. Details will be described later.

One embodiment of the present invention has been developed in view of the foregoing and aims to suppress the increase in contact resistance at a connecting portion of an active matrix substrate.

Solution to Problem

An active matrix substrate according to one embodiment of the present invention is an active matrix substrate including a substrate and a connecting portion supported by the substrate. The connecting portion includes a lower conductive layer supported by the substrate; a first insulating layer formed so as to cover the lower conductive layer, the first insulating layer having a contact hole that exposes a part of the lower conductive layer; a bottom conductive film that is disposed in the contact hole and covers at least a part of the exposed part of the lower conductive layer, the exposed part being exposed by the contact hole; a second insulating layer that is formed on the first insulating layer and in the contact hole and that is in contact with the bottom conductive film in the contact hole, the second insulating layer having an opening that exposes a part of the bottom conductive film; and an upper conductive layer that is disposed on the second insulating layer and in the opening and that is in contact with the bottom conductive film in the opening. The entire bottom conductive film is located on the substrate side relative to an upper surface of the first insulating layer.

In an embodiment, the second insulating layer is disposed so as to cover the bottom conductive film, at least a part of a side wall of the contact hole, and at least a part of the upper surface of the first insulating layer.

In an embodiment, the bottom conductive film is disposed so as to cover an area ranging from a bottom to a part of the side wall of the contact hole and has an end face on the side wall of the contact hole, and the second insulating layer covers the end face of the bottom conductive film.

In an embodiment, the bottom conductive film includes a metal layer.

In an embodiment, the bottom conductive film includes a transparent conductive layer.

In an embodiment, the bottom conductive film has a multilayer structure including a transparent conductive layer and a metal layer.

In an embodiment, the exposed part of the bottom conductive film, the exposed part being exposed by the opening, has a thickness d, as measured in the normal direction of a surface of the substrate, of 50 nm or more.

In an embodiment, the first insulating layer has a thickness of 1 µm or more and 3 µm or less.

In an embodiment, the upper surface of the first insulating layer is substantially flat.

In an embodiment, the first insulating layer includes an organic insulating layer.

In an embodiment, the active matrix substrate further includes a thin film transistor supported by the substrate, a first transparent electrode, and a second transparent electrode disposed over the first transparent electrode with the second insulating layer interposed therebetween. The lower conductive layer is formed from a conductive film from which a source electrode of the thin film transistor is also formed. The upper conductive layer is formed from a conductive film from which the second transparent electrode is also formed. The bottom conductive film includes a transparent conductive layer formed from a transparent conductive film from which the first transparent electrode is also formed.

In an embodiment, the active matrix substrate further includes a metal wire formed between the lower conductive layer and the upper conductive layer and electrically connected to the first transparent electrode. The bottom conductive film has a multilayer structure including the transparent conductive layer and a metal layer formed from a metal film from which the metal wire is also formed.

In an embodiment, the thin film transistor has a channel etch structure.

In an embodiment, the thin film transistor includes an oxide semiconductor layer that serves as an active layer.

In an embodiment, the oxide semiconductor layer contains an In—Ga—Zn—O semiconductor. The oxide semiconductor layer may have a crystalline portion.

In an embodiment, the bottom conductive film includes a conductive layer formed from a conductive film from which a wire for driving an in-cell touch panel is also formed.

A display device according to one embodiment of the present invention is an in-cell touch panel display device including the above-described active matrix substrate.

A method for producing an active matrix substrate according to one embodiment of the present invention includes a step (A) of forming a lower conductive layer on a substrate; a first insulating layer forming step (B) of forming a first insulating layer that covers the lower conductive layer, the first insulating layer having a contact hole that exposes a part of the lower conductive layer; a bottom conductive film forming step of forming a bottom conductive film in the contact hole such that the bottom conductive film covers at least a part of the exposed part of the lower conductive layer, the exposed part being exposed by the contact hole, the bottom conductive film having an upper surface located on the substrate side relative to an upper surface of the first insulating layer; a second insulating layer forming step (D) of forming a second insulating layer on the first insulating layer and in the contact hole such that the second insulating layer is in contact with the bottom conductive film in the contact hole, the second insulating layer having an opening that exposes at least a part of the bottom conductive film; and a step (E) of forming an upper conductive layer on the second insulating layer and in the opening such that the upper conductive layer is in contact with the bottom conductive film in the opening. By these steps, a connecting portion that electrically connects the lower conductive layer and the upper conductive layer to each other is formed.

In an embodiment, the active matrix substrate further includes a thin film transistor, a first transparent electrode, and a second transparent electrode disposed over the first transparent electrode with the second insulating layer interposed therebetween. In the step (A), the lower conductive layer is formed from a conductive film from which a source electrode of the thin film transistor is also formed. In the step (C), the bottom conductive film includes a transparent conductive layer, and the transparent conductive layer is formed from a transparent conductive film from which the first transparent electrode is also formed. In the step (F), the upper conductive layer is formed from a conductive film from which the second transparent electrode is also formed.

In an embodiment, the bottom conductive film has a multilayer structure including the transparent conductive layer and a metal layer.

In an embodiment, the bottom conductive film includes a conductive layer formed from a conductive film from which a wire for driving an in-cell touch panel is also formed.

A method for producing an active matrix substrate according to another embodiment of the present invention is a method for producing an active matrix substrate including a thin film transistor and a connecting portion. The method includes a step (a) of forming, on a substrate, a gate electrode and a gate insulating layer that covers the gate electrode; a step (b) of forming, on the gate insulating layer, a semiconductor layer that serves as an active layer of the thin film transistor; a step (c) of forming a source conductive film that covers the gate insulating layer and the semiconductor layer and patterning the source conductive film, thereby forming a source electrode and a drain electrode of the thin film transistor and a lower conductive layer of the connecting portion; a step (d) of forming a first insulating layer that covers the lower conductive layer and forming, in the first insulating layer, a contact hole that exposes a part of the lower conductive layer; a step (e) of forming a first transparent conductive film in the contact hole and on the first insulating layer and patterning the first transparent conductive film, thereby forming a first transparent electrode located on the first insulating layer and forming a transparent conductive layer located in the contact hole, wherein the transparent conductive layer covers at least a part of the exposed part of the lower conductive layer, the exposed part being exposed by the contact hole, and has an upper surface located on the substrate side relative to an upper surface of the first insulating layer; a step (f) of forming, on the first insulating layer and in the contact hole, a second insulating layer such that the second insulating layer is in contact with a bottom conductive film including the transparent conductive layer in the contact hole and forming, in the second insulating layer, an opening that exposes at least a part of the bottom conductive film; and a step (g) of forming a second transparent conductive film on the second insulating layer and in the opening and patterning the second transparent conductive film, thereby forming a second transparent electrode located on the second insulating layer and forming an upper conductive layer that is contact with the bottom conductive film in the opening. By these steps, a connecting portion that electrically connects the lower conductive layer and the upper conductive layer to each other via the bottom conductive film is formed.

In an embodiment, the method further includes, between the step (e) and the step (f), a step of forming a conductive film on the first insulating layer and in the contact hole and patterning the conductive film, thereby forming a wire electrically connected to the first transparent electrode and forming another conductive layer that is in contact with the transparent conductive layer in the contact hole. The bottom conductive film has a multilayer structure including the transparent conductive layer and the other conductive layer.

In an embodiment, the wire includes a wire for driving as in-cell touch panel.

In an embodiment, the thin film transistor has a channel etch structure.

In an embodiment, the semiconductor layer is an oxide semiconductor layer.

In an embodiment, the oxide semiconductor layer contains an In—Ga—Zn—O semiconductor. The oxide semiconductor layer may have a crystalline portion.

Advantageous Effects of Invention

According to one embodiment of the present invention, the increase in contact resistance at a connecting portion of an active matrix substrate can be suppressed.

DESCRIPTION OF EMBODIMENTS

First Embodiment

Figure 1:
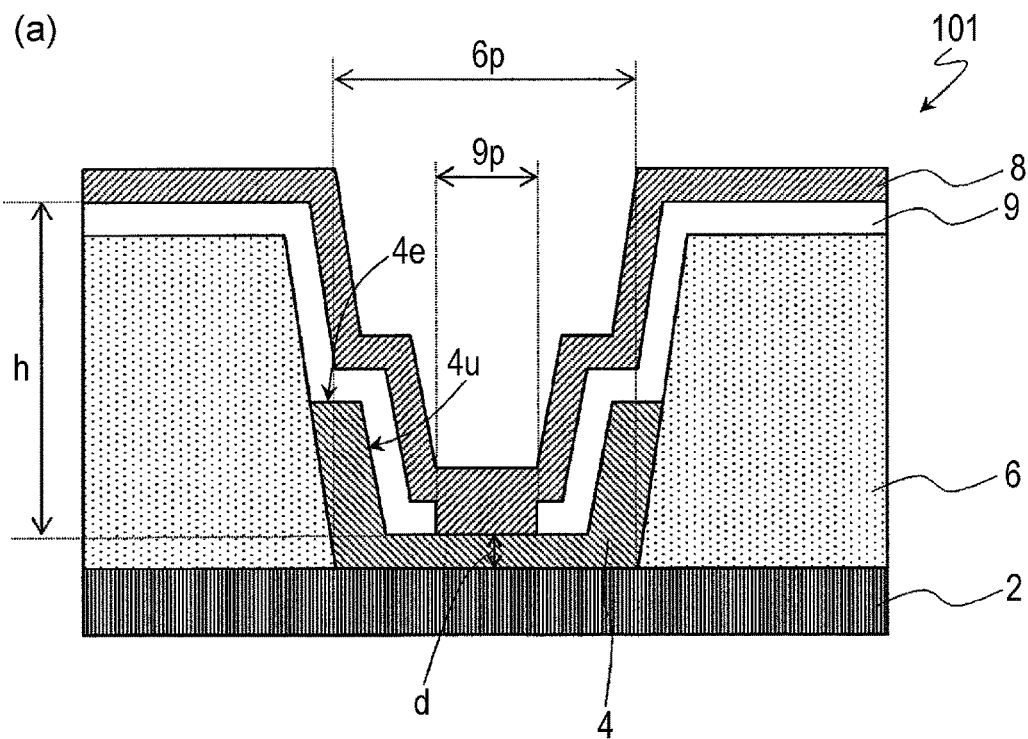
FIGS. 1(a) and 1(b) are sectional and plan views, respectively, schematically illustrating a connecting portion 101 of an active matrix substrate according to a first embodiment.
Figure 1:
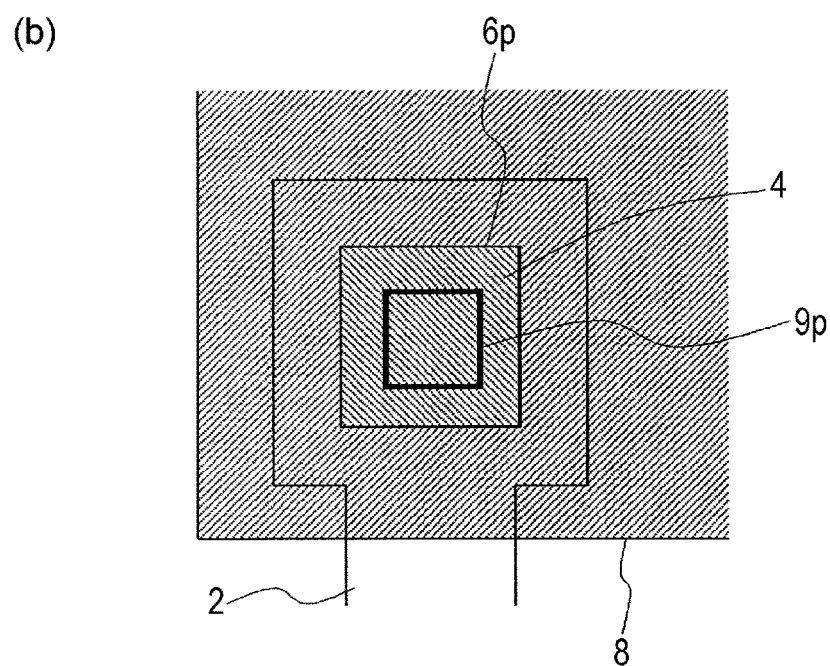

A semiconductor device according to a first embodiment will now be described with reference to the drawings. Hereinafter, the semiconductor device will be described in the context of an active matrix substrate used in a liquid crystal display device, but the semiconductor device according to the embodiment of the present invention includes active matrix substrates of other transmissive display devices, for example, electrophoresis display devices, micro electromechanical system (MEMS) display devices, and organic electroluminescence (EL) display devices.

The semiconductor device according to this embodiment includes a substrate and at least one connecting portion thereon that electrically connects two conductive layers together. The connecting portion may be a contact portion between a pixel electrode and a drain electrode of a TFT or any other connecting portion such as a terminal portion.

FIGS. 1(a) and 1(b) are sectional and plan views, respectively, schematically illustrating a connecting portion 101 in the semiconductor device according to the first embodiment.

The connecting portion 101 includes a lower conductive layer 2 supported by a substrate (not show)), a first insulating layer 6 formed so as to cover the lower conductive layer 2, a bottom conductive film 4, a second insulating layer 9, and an upper conductive layer 8.

The first insulating layer 6 has a contact hole 6p that exposes a part of the lower conductive layer 2.

The bottom conductive film 4 is disposed in the contact hole 6p and covers at least a part of the exposed part of the lower conductive layer 2, the exposed part being exposed by the contact hole 6p. The entire bottom conductive film 4 is located on the substrate side relative to an upper surface of the first insulating layer 6. In other words, the bottom conductive film 4 is not formed on the upper surface of the first insulating layer 6. In this example, the bottom conductive film 4 is disposed so as to cover an area ranging from the bottom to a part of the side wall of the contact hole 6p and has an end face 4e on the side wall of the contact hole 6p.

The second insulating layer 9 is formed on the first insulating layer 6 and in the contact hole 6p and is in contact with the bottom conductive film 4 in the contact hole 6p. The second insulating layer 9 has an opening 9p that exposes a part of the bottom conductive film 4 at the bottom of the contact hole 6p. The second insulating layer 9 may be disposed so as to cover the bottom conductive film 4, at least a part of the side wall of the contact hole 6p, and at least a part of the upper surface of the first insulating layer 6. In this example, the second insulating layer 9 is disposed so as to cover an area ranging from an upper surface 4u of the bottom conductive film 4 to the side wall of the contact hole 6p, the area including the end face 4e of the bottom conductive film 4.

The upper conductive layer 8 is disposed on the second insulating layer 9 and in the opening 9p and is in contact with the bottom conductive film 4 in the opening 9p. In other words, the upper conductive layer 8 is electrically connected to the lower conductive layer 2 via the bottom conductive film 4.

As described above, the conventional connecting portion disclosed, for example, in PTL 2 is disadvantageous in that when it has a deep contact hole, breaking of an upper conductive film occurs to cause an increase in contact resistance. In the connecting portion disclosed in PTL 3, a conductive material film is formed so as to cover the side wall of a contact hole, whereby the increase in contact resistance can be suppressed. However, the investigation by the present inventors showed that in the structure proposed in PTL 3, the coverage of an upper conductive film may be reduced by a step formed by the edge of the conductive material film formed on the inner wall of the contact hole. A reduction in coverage may cause an increase in contact resistance.

In the connecting portion 101 in this embodiment, the second insulating layer 9 disposed in the contact hole 6p so as to cover the bottom conductive film 4 can lessen the step formed by the disposition of the bottom conductive film 4. Consequently, the coverage of the upper conductive layer 8 can be improved in the contact hole 6p, so that the occurrence of breaking in the upper conductive layer 8 can be suppressed, and the increase in contact resistance can be suppressed.

Furthermore, in the connecting portion disclosed in PTL 3, the upper conductive film and the conductive material film are thicker in the vicinity of the upper end of the contact hole and thinner in the contact hole. Thus, when the contact hole is deep, breaking of the upper conductive film may not be sufficiently suppressed.

By contrast, in the example shown in FIG. 1, the bottom conductive film 4 is disposed so as to cover the bottom of the contact hole 6p. The upper conductive layer 8 is formed in the contact hole 6p so as to be in contact not with the lower conductive layer 2 but with the bottom conductive film 4 disposed thereon. This can more effectively reduce the risk of breaking which may be caused when the contact hole 6p is deep.

In this description, a distance h in the normal direction of the substrate between a contact plane of the upper conductive layer 8 at the bottom of the contact hole 6p and a portion of the upper conductive layer 8 that is located at the margin of the contact hole 6p is referred to as a substantial height of the contact hole (or a "contact hole height"). In this example, the contact hole height h is determined by subtracting a thickness d of the exposed part of the bottom conductive film 4, the exposed part being exposed by the opening 9p, from the thickness of the insulating layers disposed between the lower conductive layer 2 and the upper conductive layer 8 (the total thickness of the first insulating layer 6 and the second insulating layer 9). Therefore, the contact hole height h can be reduced compared to the conventional structures (PTLs 2 and 3) by the thickness d of the bottom conductive film 4. The thickness d is not particularly limited but is, for example, 50 nm or more and less than the thickness of the above insulating layers.

The bottom conductive film 4 may be a metal layer or a transparent conductive layer. As described later, the bottom conductive film 4 may have a multilayer structure including a metal layer and a transparent conductive layer. For example, the bottom conductive film 4 may be formed using a transparent conductive film from which a transparent electrode such as a common electrode is also formed, or may be formed using a metal film from which a wire connected to the transparent electrode is also formed.

The structure of the connecting portion is not limited to the example shown in FIG. 1. For example, as illustrated in FIG. 2(a), the bottom conductive film 4 may cover only a part of the bottom of the contact hole 6p (a surface region of the lower conductive layer 2 that is exposed by the contact hole 6p. In a connecting portion 102 shown in FIG. 2(a), the bottom conductive film 4 is disposed so as to cover an area ranging from a part of the bottom to a part of the side wall of the contact hole 6p. Also in this case, the step formed by the end face 4e of the bottom conductive film 4 is lessened by the second insulating layer 9, and hence the same effects as described above are produced.

In each of the examples shown in FIG. 1 and FIG. 2(a), the bottom conductive film 4 has the upper surface 4u reflected by the shape of the contact hole 6p and has the end face 4e on the side wall of the contact hole 6p. Alternatively, as illustrated in FIG. 2(b), the bottom conductive film 4 may be disposed so as to fill the bottom of the contact hole 6p and may have the upper surface 4u on the side wall of the contact hole 6p. Also in this case, by disposing the second insulating layer 9 so as to cover the bottom conductive film 4, the step formed between the upper surface 4u of the bottom conductive film 4 and the side wall of the contact hole 6p can be lessened. In addition, the contact hole height h can be advantageously reduced.

<Configuration of Active Matrix Substrate>

Next, a configuration of an active matrix substrate having the connecting portion 101 will be described in more detail with reference to the drawings.

Hereinafter, a description will be made in the context of an active matrix substrate used in a liquid crystal display device that provides a display in a fringe field switching (FFS) mode, but the display mode of the liquid crystal display device is not limited to a particular mode. In the following description, elements having substantially the same functions as those of the elements in FIG. 1 will be denoted by like references, and their descriptions may be omitted.

FIGS. 3(a) and 3(b) are schematic sectional and plan views, respectively, of an active matrix substrate 1001. FIG. 3(a) corresponds to a section taken along line A-A' in FIG. 3(b).

The active matrix substrate 1001 includes a substrate (typically, a transparent substrate) 11, a thin film transistor (TFT) 201 supported by the substrate 11, a first transparent electrode 27b, a second transparent electrode 28, and a connecting portion 101.

The TFT 201 is an oxide semiconductor TFT. The TFT 201 includes a gate electrode 12, a gate insulating layer 14, an oxide semiconductor layer 16, a source electrode 18s, and a drain electrode 18d.

The gate electrode 12 is electrically connected to a gate wire (gate bus line) G (is branching off from the gate wire G, in this embodiment), and a scanning signal is supplied from the gate wire G. The gate insulating layer 14 is formed so as to cover the gate electrode 12. The oxide semiconductor layer 16 has an island shape and is formed so as to overlie the gate electrode 12 with the gate insulating layer 14 interposed therebetween.

The source electrode 18s is electrically connected to a source wire (source bus line) S (is branching off from the source wire S, in this embodiment), and a display signal is supplied from the source wire S. The source electrode 18s is disposed so as to be in contact with a part (referred to as a source region) of the oxide semiconductor layer 16. The drain electrode 18d is disposed so as to be in contact with another part (referred to as a drain region) of the oxide semiconductor layer 16. A region lying between the source region and the drain region of the oxide semiconductor layer 16 is referred to as a channel region.

The first insulating layer 6 is formed so as to cover the TFT 201 having the configuration described above. In this example, the first insulating layer 6 has a mule slayer structure including an inorganic insulating layer (passivation film) 22 and an organic insulating layer 24 formed on the inorganic insulating layer 22. The organic insulating layer 24 is typically formed of a photosensitive resin material.

The first transparent electrode 27b is disposed on the first insulating layer 6. The second transparent electrode 28 is disposed over the first transparent electrode 27b with the second insulating layer 9 interposed therebetween.

The connecting portion 101 is a pixel contact portion that electrically connects the drain electrode 18d, which is the lower conductive layer 2, of the TFT 201 and the second transparent electrode 28, which is the upper conductive layer 8, to each other. The configuration of the connecting portion 101 is the same as the above configuration described with reference to FIG. 1. The bottom conductive film 4 may be formed from a transparent conductive film from which the first transparent electrode 27b is also formed. This enables the formation of the connecting portion 101 having excellent contact properties without a complicated production process.

In this embodiment, the first transparent electrode 27b is formed so as to be continuous throughout all the pixels of the liquid crystal display device. However, the first transparent electrode 27b is not formed in the vicinity of the connecting portion 101 for electrically connecting the drain electrode 18d of the TFT 201 and the second transparent electrode 28 to each other. In this example, the first transparent electrode 27b has an opening 27p in a region including the connecting portion 101 and the TFT 201, as shown in FIG. 3(b). The first transparent electrode 27b functions as a common electrode in response to the supply of a common signal (COM signal).

The second transparent electrode 28 is independently (separately) formed for each pixel of the liquid crystal display device. Although not illustrated, the second transparent electrode 28 has at least one slit. The second transparent electrode 28 is electrically connected to the drain electrode 18d of the TFT 201 in the connecting portion 101 and functions as a pixel electrode.

When viewed from the normal direction of the substrate 11, the second transparent electrode 28 may at least partially overlap the first transparent electrode 27b with the second insulating layer 9 interposed therebetween. With this configuration, a transparent auxiliary capacitance is generated in a pixel by the first and second transparent electrodes 27b and 28 and the second insulating layer 9 lying therebetween.

Although not illustrated, in the liquid crystal display device, an opposing substrate is disposed so as to face the active matrix substrate 1001, and a liquid crystal layer is disposed between the active matrix substrate 1001 and the opposing substrate.

Figure 2:
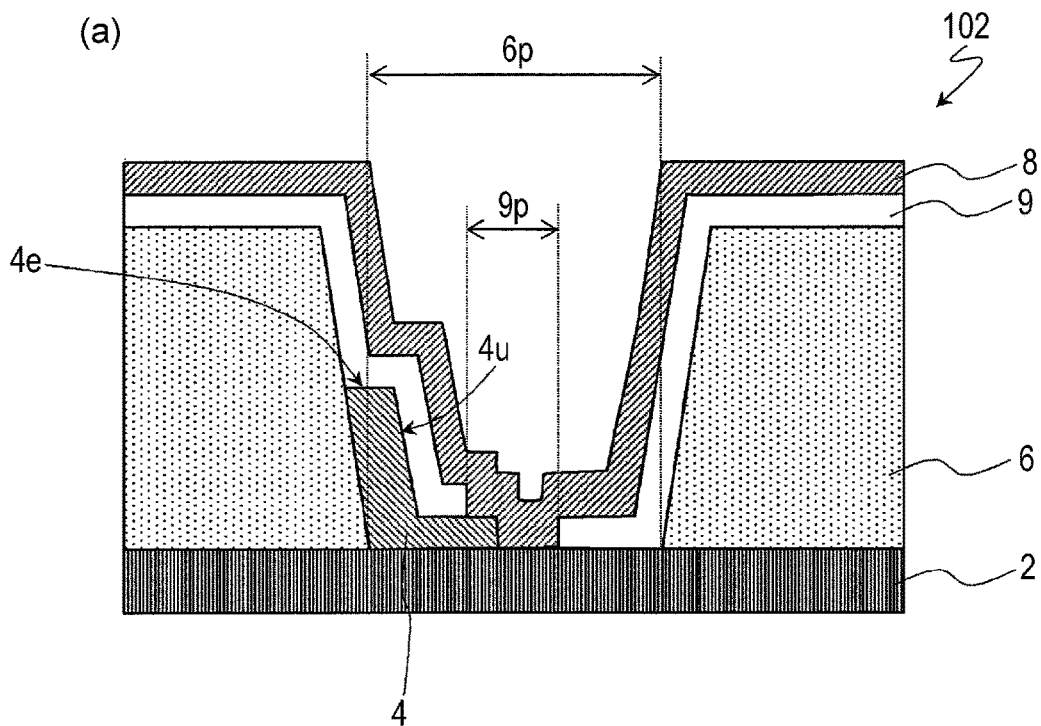
FIGS. 2(a) and 2(b) are sectional views each illustrating another connecting portion in the first embodiment.
Figure 2:
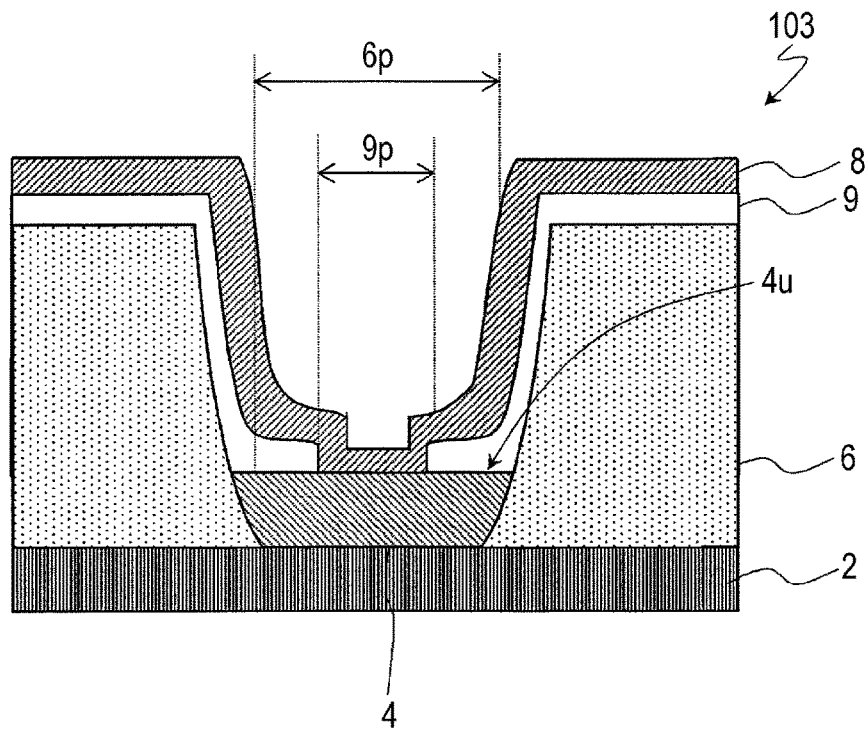

The active matrix substrate according to this embodiment may be any active matrix substrate having at least one connecting portion having the structure described with reference to FIG. 1 or FIG. 2. The connecting portion is not limited to a pixel contact portion and may be, for example, a terminal portion that connects a source or gate wire and an upper conductive layer overlying the wire to each other.

<Material and Structure of TFT 201>

In this embodiment, the TFT 201, which includes the oxide semiconductor layer 16 as an active layer, is used as a switching element disposed for each pixel.

The oxide semiconductor contained in the oxide semiconductor layer 16 may be an amorphous oxide semiconductor or a crystalline oxide semiconductor having a crystalline portion. Examples of such a crystalline oxide semiconductor include a polycrystalline oxide semiconductor, a microcrystal oxide semiconductor, or a crystalline oxide semiconductor whose c axis is aligned substantially perpendicularly to a layer plane.

The oxide semiconductor layer 16 may have a multilayer structure including two or more layers. When the oxide semiconductor layer 16 has a multilayer structure, the oxide semiconductor layer 16 may include an amorphous oxide semiconductor layer and a crystalline oxide semiconductor layer. Alternatively, the oxide semiconductor layer 16 may include a plurality of crystalline oxide semiconductor layers of different crystal structures. The oxide semiconductor layer 16 may also include a plurality of amorphous oxide semiconductor layers. When the oxide semiconductor layer 16 has a two-layer structure including an upper layer and a lower layer, the energy gap of an oxide semiconductor contained in the upper layer is preferably larger than the energy gap of an oxide semiconductor contained in the lower layer. In cases where these layers have a relatively small difference in energy gap, the energy gap of the oxide semiconductor of the lower layer may be larger than the energy cap of the oxide semiconductor of the upper layer.

Materials and structures of an amorphous oxide semiconductor and the crystalline oxide semiconductors described above, methods of forming these semiconductors into films, configurations of oxide semiconductor layers having multilayer structures, etc. are disclosed, for example, in Japanese Unexamined Patent Application Publication No. 2014-007399. The entire contents of Japanese Unexamined Patent Application Publication No. 2014-007399 are incorporated herein by reference.

The oxide semiconductor layer 16 may contain at least one metal element selected, for example, from In, Ga, and Zn. In this embodiment, the oxide semiconductor layer 16 contains, for example, an In—Ga—Zn—O-based semiconductor (e.g., indium gallium zinc oxide). The In—Ga—Zn—O-based semiconductor is a ternary oxide of In (indium), Ga (gallium), and Zn (zinc), and In, Ga, and Zn may be in any ratio (composition ratio), for example, In:Ga:Zn=2:2:1, In:Ga:Zn=1:1:1, or In:Ga:Zn=1:1:2. The oxide semiconductor layer 16 having such a composition can be formed from an oxide semiconductor film containing an In—Ga—Zn—O-based semiconductor. A channel-etched TFT having an active layer including an oxide semiconductor such as an In—Ga—Zn—O-based semiconductor may be referred to as a "CE-OS-TFT".

The In—Ga—Zn—O-based semiconductor may be amorphous or crystalline. A preferred crystalline In—Ga—Zn—O-based semiconductor is a crystalline In—Ga—Zn—O-based semiconductor whose c axis is aligned substantially perpendicularly to a layer plane.

The crystal structure of a crystalline In—Ga—Zn—O-based semiconductor is disclosed, for example, in Japanese Unexamined Patent Application Publication No. 2014-007399 described above, Japanese Unexamined. Patent Application Publication No. 2012-134475, and Japanese Unexamined Patent Application Publication No. 2014-209727. The entire contents of Japanese Unexamined Patent Application Publication No. 2012-134475 and Japanese Unexamined Patent Application Publication No. 2014-209727 are incorporated herein by reference. A TFT including an In—Ga—Zn—O semiconductor layer has a high mobility (More than 20 times as high as that of an a-Si TFT) and a low leak current (less than one-hundredth of that of a-Si TFT) and thus is suitable for use as a drive TFT (e.g., a TFT included in a drive circuit on the periphery of a display region including a plurality of pixels, the drive circuit and the display region being disposed on the same substrate) and a pixel TFT (a TFT disposed in a pixel).

The oxide semiconductor layer 16 may contain another oxide semiconductor instead of the In—Ga—Zn—O semiconductor. For example, the oxide semiconductor layer 16 may contain an In—Sn—Zn—O semiconductor (e.g., $In_2O_3$—$SnO_2$—ZnO; InSnZnO). The In—Sn—Zn—O semiconductor is a ternary oxide of In (indium), Sn (tin), and Zn (zinc). Alternatively, the oxide semiconductor layer 16 may contain, for example, an In—Al—Zn—O semiconductor, an In—Al—Sn—Zn—O semiconductor, a Zn—O semiconductor, an In—Zn—O semiconductor, a Zn—Ti—O semiconductor, a Cd—Ge—O semiconductor, a Cd—Pb—O semiconductor, CdO (cadmium oxide), a Mg—Zn—O semiconductor, an In—Ga—Sn—O semiconductor, an In—Ga—O semiconductor, a Zr—In—Zn—O semiconductor, a Hf—In—Zn—O semiconductor, an Al—Ga—Zn—O semiconductor, or a Ga—Zn—O semiconductor.

Figure 3:
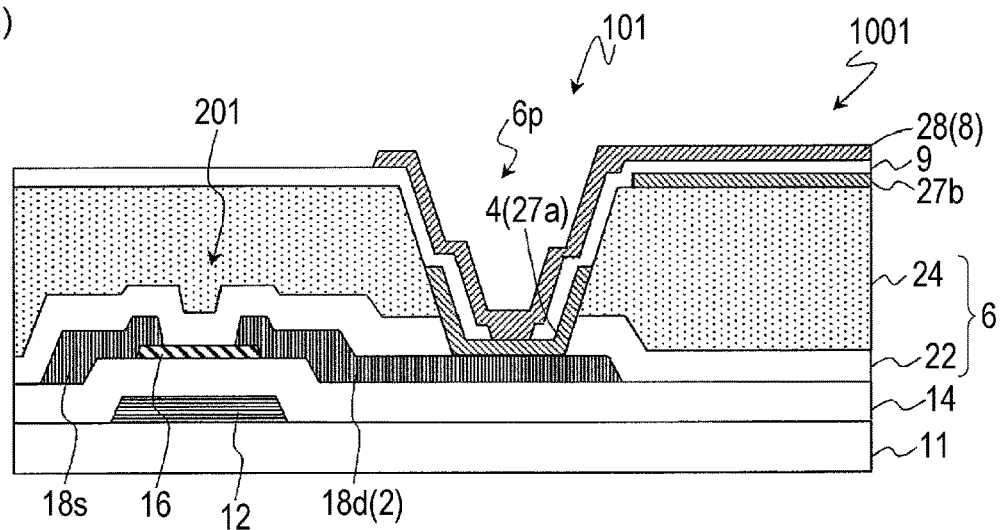
FIGS. 3(a) and 3(b) are sectional and plan views, respectively, schematically illustrating an active matrix substrate 1001 according to the first embodiment.
Figure 3:
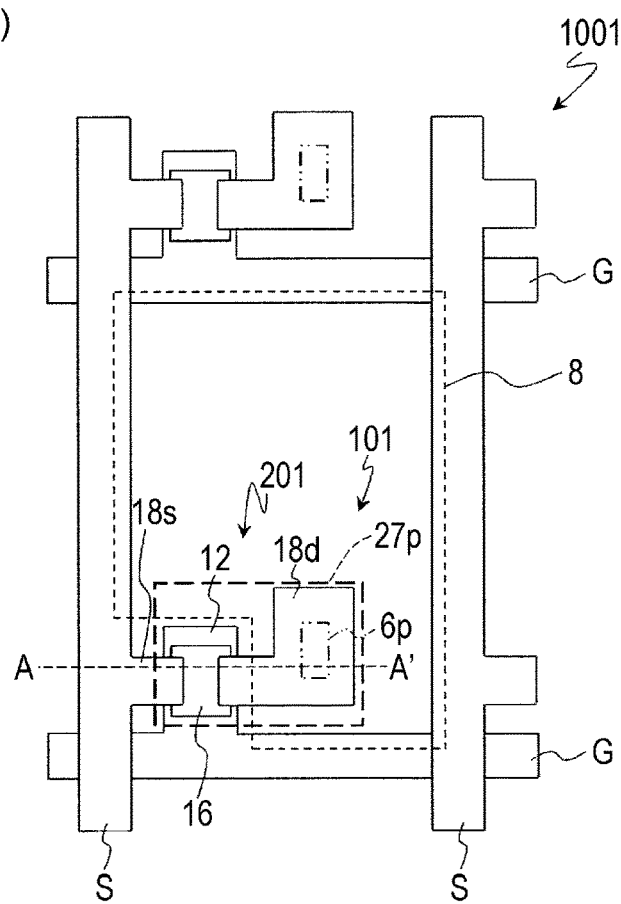

In the example shown in FIG. 3, the TFT 201 is a channel-etched TFT having a bottom gate structure. In such a "channel-etched TFT", no etch stop layer is formed in a channel region, and lower surfaces of channel-side ends of source and drain electrodes are disposed so as to be in contact with an upper surface of an oxide semiconductor layer, as shown in FIG. 3(a). Such a channel-etched TFT is formed, for example, by forming conductive films for source and drain electrodes on an oxide semiconductor layer and performing source-drain separation. In the source-drain separation step, a surface portion of the channel region may be etched.

The TFT 201 for use in this embodiment may be an etch stop TFT in which an etch stop layer is formed on a channel region. In such an etch stop TFT, lower surfaces of channel-side ends of source and drain electrodes are located, for example, on an etch stop layer. The etch stop TFT is formed, for example, by forming an etch stop layer that covers a portion that serves as a channel region of an oxide semiconductor layer, then forming conductive films for source and drain electrodes on the oxide semiconductor layer and the etch stop layer, and performing source-drain separation.

Although the TFT 201 shown in FIG. 3(a) has a top-contact structure in which source and drain electrodes are in contact with the upper surface of the oxide semiconductor layer 16, the source and drain electrodes may be disposed so as to be in contact with the lower surface of the oxide semiconductor layer 16 (bottom-contact structure). Furthermore, the TFT 201 may have a bottom-gate structure in which the gate electrode 12 is disposed on the substrate 11 side of the oxide semiconductor layer 16 or a top-gate structure in which the gate electrode 12 is disposed above the oxide semiconductor layer 16.

Furthermore, the TFT 201 may be a TFT including, as an active layer, a semiconductor (e.g., amorphous silicon) other than oxide semiconductors.

<Method for Producing Active Matrix Substrate 1001>

Figure 4:
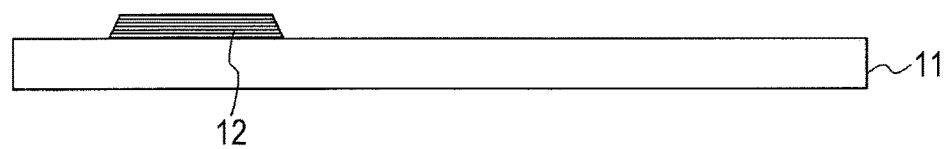
FIGS. 4(a) to 4(e) are each a schematic sectional process diagram for illustrating a method for producing the active matrix substrate 1001.
Figure 4:
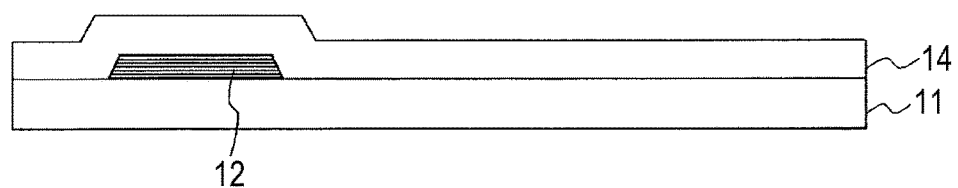
Figure 4:
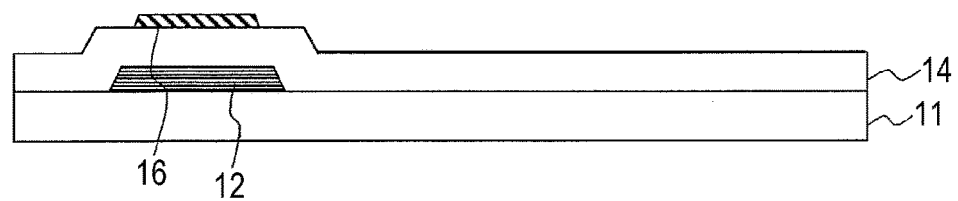
Figure 4:
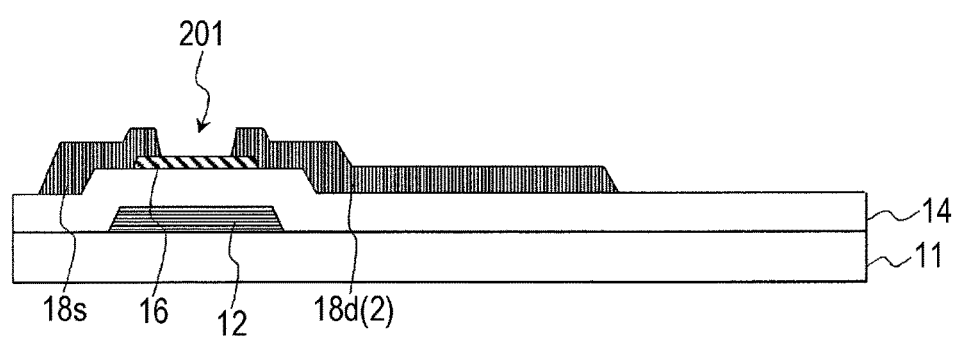
Figure 4:
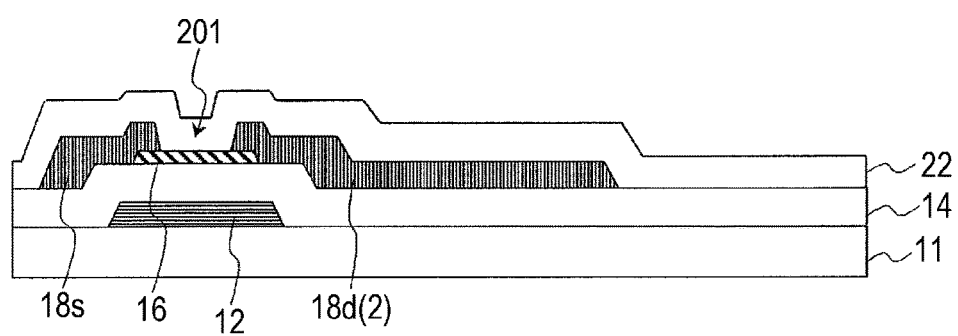
Figure 5:
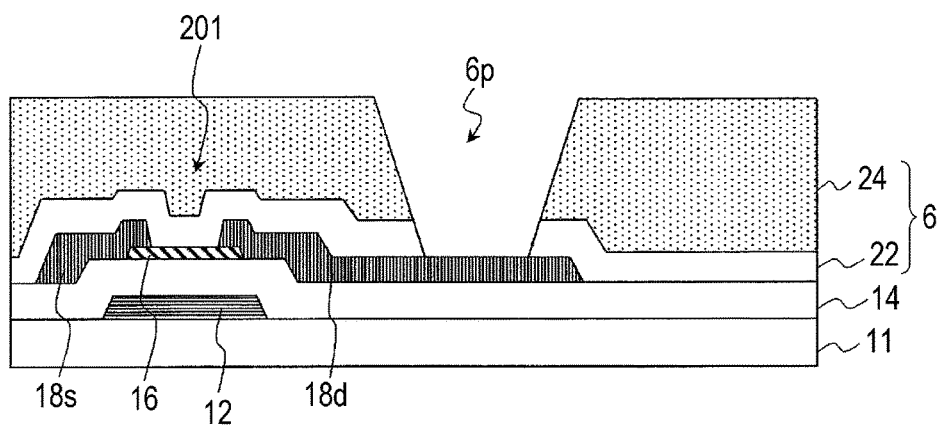
FIGS. 5(a) to 5(c) are each a schematic sectional process diagram for illustrating the method for producing the active matrix substrate 1001.
Figure 5:
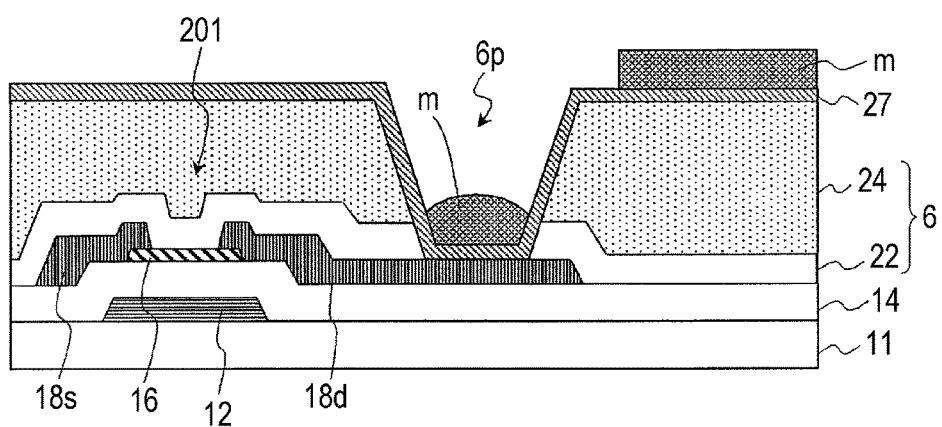
Figure 5:
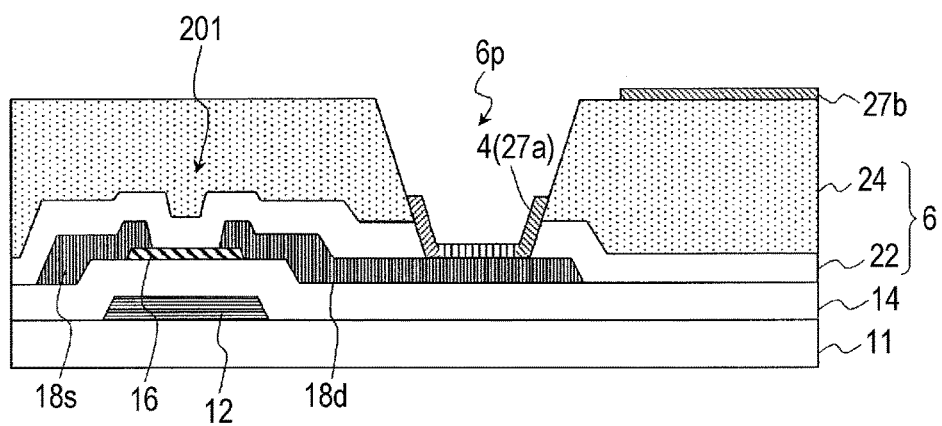

Next, an exemplary method for producing the active matrix substrate 1001 will be described with reference to FIG. 4, FIG. 5, and FIG. 6. FIGS. 4(a) to 4(e), FIGS. 5(a) to 5(c), and FIGS. 6(a) and 6(b) are sectional process diagrams schematically illustrating a process for producing the active matrix substrate 1001.

First, as shown in FIG. 4(a), the gate electrode 12 and a gate wire (not shown) of a TFT are formed on the substrate 11.

As the substrate 11, a glass substrate, a plastic substrate having heat resistance, or the like can be used.

The gate electrode 12 and the gate wire are formed, for example, by depositing a gate conductive film (thickness: 50 nm or more and 500 nm or less, for example) on the substrate 11, for example, by sputtering and then patterning the gate conductive film using a photolithography process.

As the gate conductive film, a metal film containing an element selected, for example, from aluminum. (Al), chromium (Cr), copper (Cu), tantalum (Ta), titanium (Ti), molybdenum (Mo), and tungsten (N), an alloy film containing any of these elements, or the like can be used. A multilayer film including two or more of these films may also be used. For example, a multilayer film having a three-layer structure of titanium film/aluminum film/titanium film or a three-layer structure of molybdenum film/aluminum film/molybdenum film can be used. The gate conductive film may also have a monolayer structure, a two-layer structure, or a multilayer structure including four or more layers, as well as a three-layer structure. Here, a multilayer film (W/TaN) including a W film (thickness: 5 to 500 nm) as an upper layer and TaN (thickness: 5 to 100 nm) as a lower layer is used as the gate conductive film.

Next, as shown in FIG. 4(b), the gate insulating layer 14, which covers the gate electrode 12 and the gate wire, is formed, for example, by chemical vapor deposition (CVD).

As the gate insulating layer 14, a silicon oxide ($SiO_2$) layer, a silicon nitride (SiNx) layer, a silicon oxide nitride (SiOxNy; x>y) layer, a silicon nitride oxide (SiNxOy; x>y) layer, an aluminum oxide layer, a tantalum oxide layer, or the like can appropriately be used. The gate insulating layer 14 may have a multilayer structure. Here, for example, the gate insulating layer 14 having a multilayer film structure including a silicon nitride (SiNx) layer (thickness: 100 to 500 nm) as a lower layer and a silicon oxide (SiOx) layer (thickness: 20 to 100 nm) as an upper layer is formed by CVD.

Subsequently, as shown in FIG. 4(c), an oxide semiconductor film (thickness: 20 nm or more and 200 nm or less, for example) is deposited on the gate insulating layer 14, for example, by sputtering or CVD, and the oxide semiconductor film is then patterned using a photolithography process, thereby forming the oxide semiconductor layer 16 having an island shape. Here, as the oxide semiconductor film, an In—Ga—Zn—O-based semiconductor (hereinafter referred to as an "In—Ga—Zn—O semiconductor" for short) film having a thickness of 50 nm is formed by sputtering.

Next, as shown in FIG. 4(d), a source conductive film (thickness: 50 nm or more and 500 nm or less, for example) is deposited on the oxide semiconductor layer 16, for example, by sputtering, and the source conductive film is then patterned using a photolithography process, thereby forming the source electrode 18s, the drain electrode 18d, and a source wire (not shown).

As the source conductive film, an element selected, for example, from aluminum (Al), chromium (Cr), copper (Cu), tantalum (Ta), titanium (Ti), molybdenum (Mo), and tungsten (W), an alloy containing any of these elements, or the like can be used. For example, the source conductive film may have a three-layer structure of titanium film/aluminum film/titanium film or a three-layer structure of molybdenum film/aluminum film/molybdenum film. The source conductive film may also have a monolayer structure, a two-layer structure, or a multilayer structure including four or more layers, as well as a three-layer structure. Here, for example, a multilayer film (Ti/Al/Ti) including a Ti film (thickness: 10 to 100 nm), an Al film (thickness: 50 to 400 nm), and a Ti film (thickness: 50 to 300 nm) stacked in this order from the substrate 11 side is used. In this manner, the TFT 201 including the oxide semiconductor layer 16 is formed.

Next, as shown in FIG. 5(a), the first insulating layer (thickness: 1 μm or more and 3 μm or less, for example) 6 is formed on the TFT 201, for example, by CVD. In this embodiment, the inorganic insulating layer (thickness: 0.1 μm or more and 1 μm or less, for example) 22 and the organic insulating layer (thickness: 1 μm or more and 3 μm or less, for example) 24 are formed in this order as the first insulating layer 6.

The inorganic insulating layer 22 may be a monolayer of a silicon oxide film, a silicon nitride film, a silicon oxide nitride film, a silicon nitride oxide film, aluminum oxide, or tantalum oxide or a laminate thereof. Here, as the inorganic insulating layer 22, for example, a multilayer film including a $SiO_2$ film as a lower layer and a silicon nitride (SiNx) film as an upper layer may be formed.

The organic insulating layer 24 is then formed on the inorganic insulating layer 22. The organic insulating layer 24 can be formed, for example, by applying a positive photosensitive resin material (e.g., an acrylic resin material) onto the inorganic insulating layer 22 and then exposing and developing the positive photosensitive resin material. In forming the organic insulating layer 24, an opening is formed at a position overlapping the drain electrode 18d. Subsequently, the inorganic insulating layer 22 is etched using the organic insulating layer 24 as a mask. In this manner, the contact hole 6p that exposes a part of the drain electrode 16d is formed in the first insulating layer 6.

The method of forming the contact hole 6p in the first insulating layer 6 is not limited to the method described above. The contact hole 6p may be formed by forming a resist mask on the first insulating layer 6 and performing patterning.

Next, as shown in FIG. 5(b), a first transparent conductive film (thickness: 20 to 300 nm) 27 is formed on the first insulating layer 6 and in the contact hole 6p. As a material for the first transparent conductive film, indium tin oxide (ITO), indium zinc oxide, or the like can be used. Here, an indium zinc oxide film having a thickness of 100 nm is used.

A resist mask m is then disposed on the first transparent conductive film 27. The resist mask m is disposed so as to cover a region where the first transparent electrode (common electrode) is to be formed and the bottom of the contact hole 6p.

Next, as shown in FIG. 5(c), the first transparent conductive film 27 is etched using the resist mask m, thereby forming the first transparent electrode 27b and a transparent conductive layer 27a, which is the bottom conductive film 4. In this example, the bottom conductive film 4 is formed of the transparent conductive layer 27a alone, but the bottom conductive film 4 may further include another layer.

The resist mask m need not cover the bottom of the contact hole 6p and may have an opening that exposes the entire contact hole 6p. In this case, a portion of the first transparent conductive film 27 can be left at the bottom of the contact hole 6p by controlling etching conditions such as etching time and the type of etching gas according to, for example, the diameter and depth of the contact hole 6p and the type and thickness of the first transparent conductive film 27. The portion of the first transparent conductive film 27 left in the contact hole 6p is the transparent conductive layer 27a.

After this, as shown in FIG. 6(a), the second insulating layer (thickness: 50 nm or more and 200 nm or less, far example) 9 is formed so as to cover the first transparent electrode 27b and the bottom conductive film 4.

The second insulating layer 9 may be a monolayer of a silicon oxide film, a silicon nitride film, a silicon oxide nitride film, a silicon nitride oxide film, aluminum oxide, or tantalum oxide or a laminate thereof. Here, as the second insulating layer 9, a SiN film is formed, for example, by CVD. After this, at the bottom of the contact hole 6p, the opening 9p that exposes a part of the bottom conductive film 4 is formed in a region where the drain electrode 18d and the bottom conductive film 4 overlap each other.

Subsequently, as shown in FIG. 6(b), a second transparent conductive film (thickness: 20 to 300 nm) is formed on the second insulating layer 9 and patterned to thereby form the second transparent electrode 28. The second transparent electrode 28 can be formed by the same method as for the first transparent electrode 27b by using the same material for the first transparent electrode 27b. Here, an indium zinc oxide film having a thickness of 100 nm is used as the second transparent conductive film. The second transparent electrode 28 is electrically connected to the drain electrode 18d via the bottom conductive film 4 in the contact hole 6p.

In this manner, the active matrix substrate 1001 illustrated in FIGS. 3(a) and 3(b) is produced.

Second Embodiment

An active matrix substrate according to a second embodiment will now be described with reference to the drawings. A connecting portion of the active matrix substrate according to this embodiment includes a bottom conductive film having a multilayer structure. In this respect, the structure of the connecting portion is different from those of the above connecting portions 101, 102, and 103 described with reference to FIG. 1 and FIG. 2.

Figure 7:
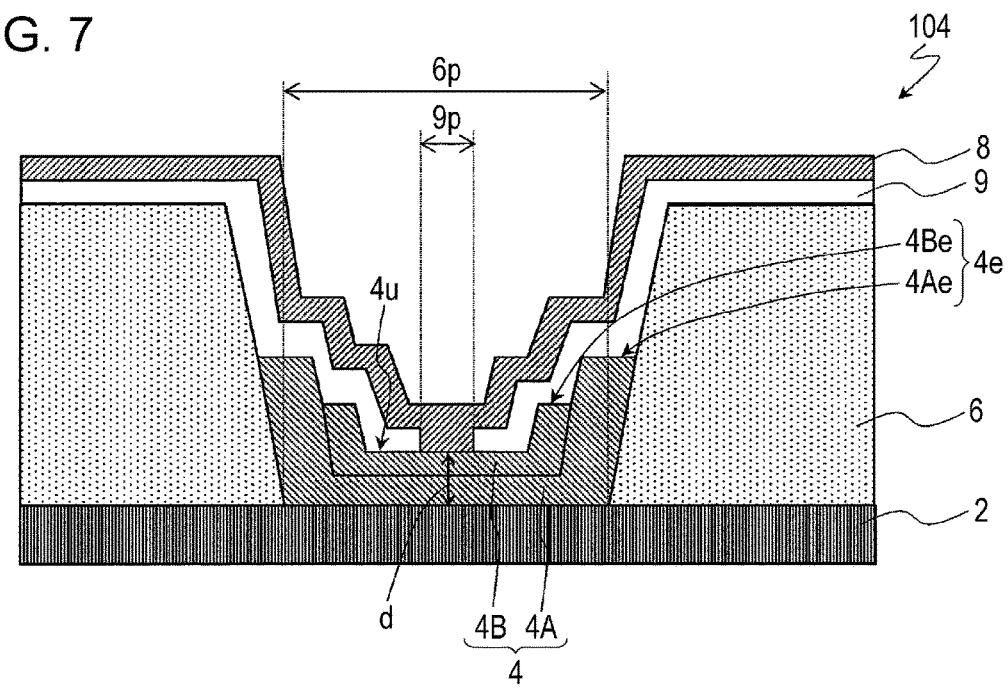
FIG. 7 is a sectional view schematically illustrating a connecting portion 104 of an active matrix substrate according to a second embodiment.

FIG. 7 is a sectional view schematically illustrating a connecting portion 104 in the second embodiment. A plan view is omitted because it is the same as that of FIG. 1(b).

In the connecting portion 104, the bottom conductive film 4 has a multilayer structure including a first layer 4A and a second layer 4B, the first layer 4A being on the substrate side. One of the first layer 4A and the second layer 4B may be formed, for example, from a conductive film from which a wire (e.g., a metal wire) connected to a transparent electrode is also formed, and the other may be formed, for example, from a transparent conductive film from which the transparent electrode (common electrode) is also formed.

Also in this embodiment, the bottom conductive film 4 is in contact with at least a part of the exposed part of the lower conductive layer 2 in the contact hole 6p, the exposed part being exposed by the contact hole 6p. The entire bottom conductive film 4 (i.e., the entire first layer 4A and the entire second layer 4B) is located on the substrate side relative to the upper surface of the first insulating layer 6.

In the example shown in FIG. 7, the first layer 4A and the second layer 4B are each disposed so as to cover an area ranging from the bottom to a part of the side wall of the contact hole 6p, and have end faces 4Ae and 4Be, respectively, on the side wall of the contact hole 6p. In this description, the end faces 4Ae and 4Be of the layers constituting the bottom conductive film 4 are collectively referred to as an end face 4e of the bottom conductive film 4. The second insulating layer 9 is disposed so as to cover an area ranging from an upper surface 4u of the bottom conductive film 4 (i.e., an upper surface of the second layer 4B) to the side wall of the contact hole 6p, the area including the end face 4Be of the second layer 4B and the end face 4Ae of the first layer 42. The upper conductive layer 8 is disposed on the second insulating layer 9 and in the opening 9p and is in contact with the bottom conductive film 4 (the second layer 4B in this example) in the opening 9p.

In the connecting portion 104 in this embodiment, the second insulating layer 9 disposed in the contact hole 6p so as to cover the bottom conductive film 4 can lessee the step formed by the disposition of the bottom conductive film 4. Consequently, the occurrence of breaking in the upper conductive layer 8 in the contact hole 6p can be suppressed, and the increase in contact resistance can be suppressed.

In the example illustrated, the bottom conductive film 4 is disposed so as to cover the bottom of the contact hole 6p, and thus the contact hole height h can be substantially reduced by the thickness d of the bottom conductive film 4. The thickness d of the bottom conductive film 4 is a total thickness of the first layer 4A and the second layer 4B. Therefore, the thickness d of the bottom conductive film 4 can be larger than in the above-described embodiment, so that breaking in the upper conductive layer 8 can be more effectively suppressed.

The shape of the layers constituting the bottom conductive film 4 is not limited to the shape illustrated in FIG. 7. The bottom conductive film 4 may cover only a part of the bottom of the contact hole 6p (a surface region of the lower conductive layer 2 that is exposed by the contact hole 6p), as described above with reference to FIG. 2(a). In other words, both the first layer 4A and the second layer 4B may cover only a part of the bottom of the contact hole 6p. Alternatively, at least one of the first layer 4A and the second layer 4B may cover only a part of the bottom of the contact hole 6p. Furthermore, as illustrated in FIG. 2(b), the first layer 4 and the second layer 4B may be disposed so as to fill the bottom of the contact hole 6p. Also in these cases, the step formed by the bottom conductive film 4 is lessened by the second insulating layer 9 in the contact hole 6p, and hence the same effects as described above are produced.

The first layer 4A may be a transparent conductive layer formed from a transparent conductive film from which a transparent electrode such as a common electrode or a detection electrode of a touch sensor is also formed. The second layer 4B may be a metal layer formed from a metal film from which a wire connected to the transparent electrode (e.g., a wire that drives a touch sensor) is also formed. Alternatively, the first layer 4A may be a metal layer, and the second layer 4B may be a transparent conductive layer. The layers constituting the bottom conductive film 4 may be any layers other than these examples. For example, the bottom conductive film 4 may be formed of a plurality of metal layers and need not include a transparent conductive layer. Furthermore, the bottom conductive film 4 may have a multilayer structure including three or more layers.

<Configuration of Active Matrix Substrate and Display Device>

Next, an exemplary active matrix substrate having the connecting portion 104 and an exemplary display device will be described in more detail with reference to the drawings.

Hereinafter, descriptions will be made in the context of an in-cell touch panel liquid crystal display device that provides a display in an FFS mode and an active matrix substrate used in such a liquid crystal display device. However, the display mode of the liquid crystal display device is not limited to a particular mode. The liquid crystal display device need not be of in-cell touch panel type. In the following description, elements having substantially the same functions as those of the elements in FIG. 3 and FIG. 7 will be denoted by like references, and their descriptions may be omitted.

Figure 8:
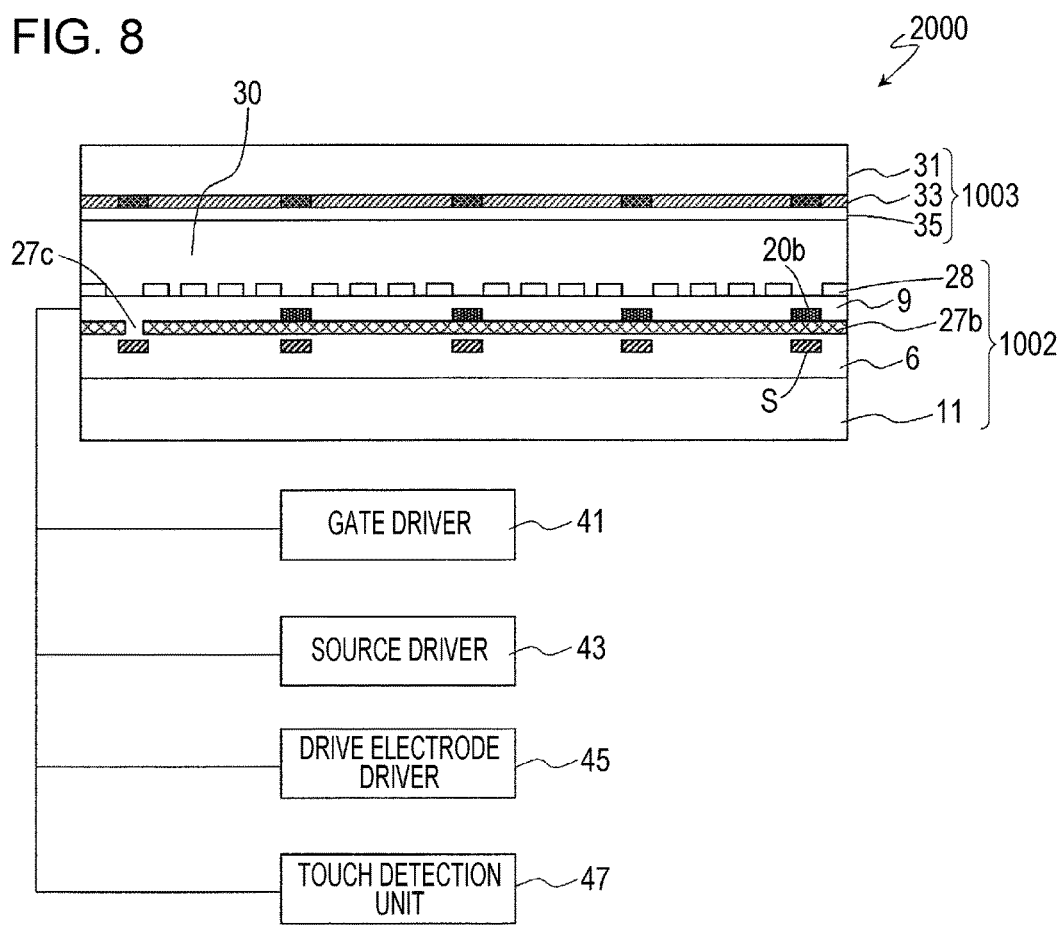
FIG. 8 is a schematic view of an in-cell touch panel liquid crystal display device 2000 including an active matrix substrate 1002 according to the second embodiment.
Figure 9:
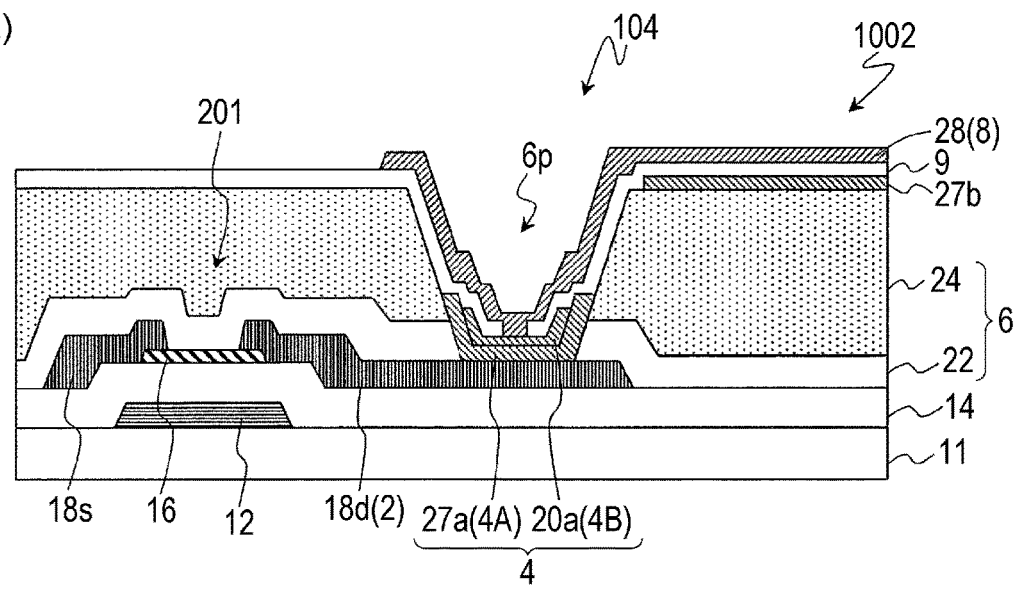
FIGS. 9(a) and 9(b) are sectional and plan views, respectively, of the active matrix substrate 1002.
Figure 9:
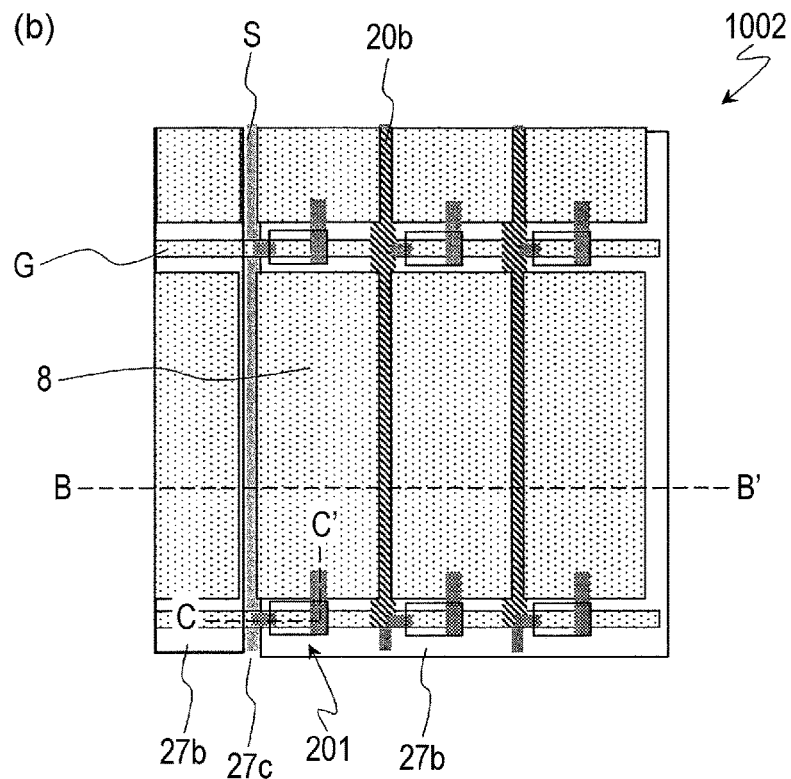

FIG. 8 illustrates an in-cell touch panel liquid crystal display device (hereinafter a "display device") 2000 according to this embodiment. FIGS. 9(a) and 9(b) are sectional and plan views, respectively, of an active matrix substrate 1002 of the display device 2000. FIG. 8 corresponds to a section taken along line B-B' in FIG. 9(b). FIG. 9(a) corresponds to a section taken along line C-C' in FIG. 9(b).

The display device 2000 includes the active matrix substrate 1002, an opposing substrate 1003 disposed on a viewer's-side of the active matrix substrate 1002, and a liquid crystal layer 30 disposed between the active matrix substrate 1002 and the opposing substrate 1003.

The active matrix substrate 1002 includes a substrate 11, a TFT 201, a plurality of first transparent electrodes 27b and a plurality of second transparent electrodes 28 for applying a voltage to the liquid crystal layer 30, and the connecting portion 104.

The second transparent electrodes 28 are disposed for each pixel and function as pixel electrodes. Each of the second transparent electrodes 28 is connected to the corresponding TFT 201 in the connecting portion 104. The second transparent electrodes 28 are provided with slits.

The first transparent electrodes 27b function not only as common electrodes but also as detection electrodes of touch sensors. As shown in FIG. 9(b), each of the first transparent electrodes (detection electrodes) 27b is formed, for example, in a region including the plurality of second transparent electrodes (pixel electrodes) 28. The detection electrodes 27b are each separated from adjacent detection electrodes by slits 27c.

Figure 6:
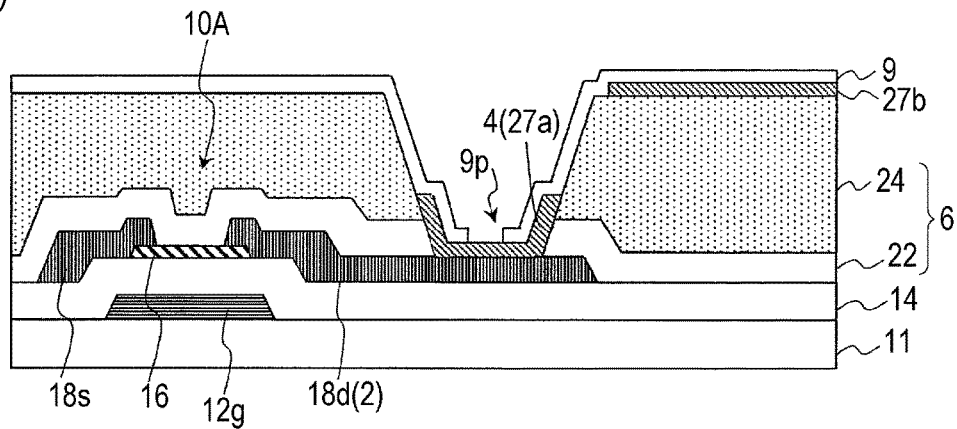
FIGS. 6(a) and 6(b) are each a schematic sectional process diagram for illustrating the method for producing the active matrix substrate 1001.
Figure 6:
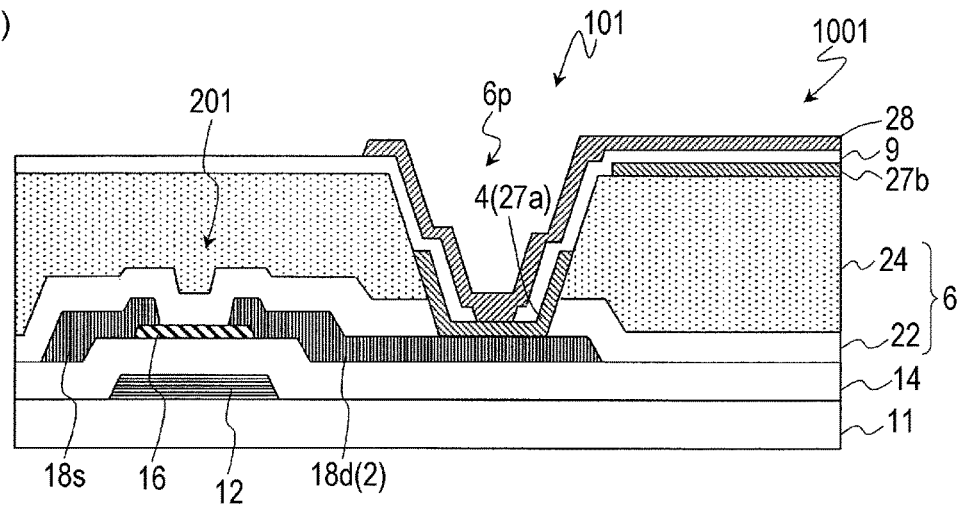

As shown in FIG. 6, the first transparent electrode (detection electrode) 27b is provided with an auxiliary wire 20b. The auxiliary wire 20b is a wire for driving a touch sensor (also referred to as a driving wire) and is disposed so as to be in contact with the first transparent electrode 27b. The auxiliary wire 20b may be disposed on the liquid crystal layer 30 side of the first transparent electrode 27b or on the opposite side. The auxiliary wire 20b, when viewed from the normal direction of the substrate 11, may be disposed so as to overlap a source wire S.

The connecting portion 104 is a pixel contact portion that connects the drain electrode 18d of the TFT 201 and the second transparent electrode 28 to each other. The configuration of the connecting portion 104 is the same as the configuration shown in FIG. 7 in this embodiment, the bottom conductive film 4 of the connecting portion 104 has a multilayer structure including the transparent conductive layer 27a (the first layer 4A) formed from a transparent conductive film from which the first transparent electrode 27b is also formed and a conductive layer 20a (the second layer 4B) formed from a conductive film from which the auxiliary wire 20b is also formed. Therefore, when the auxiliary wire 20b is disposed on the substrate 11 side of the first transparent electrode 27b, the bottom conductive film 4 has a multilayer structure including the conductive layer 20a as a lower layer and the transparent conductive layer 27a as an upper layer.

The opposing substrate 1003 includes a glass substrate 31, a color filter layer 33, and a resin layer 35. A drive electrode 36 (FIG. 10) for a touch sensor is disposed on the liquid crystal layer 30 side of the color filter layer 33.

The display device 2000 further includes a gate driver 41 that supplies a scanning signal through a gate wire to the TFT 201 disposed in a pixel region, a source driver 43 that supplies a pixel signal through a source wire to the TFT 201, a drive electrode driver 45 that supplies a drive signal to the drive electrode 36, and a touch detection unit 47 that receives a signal supplied from the first transparent electrode 27b, serving as a detection electrode, to detect a touch. In this description, a configuration which does not include at least one of these circuits 41, 43, 45, and 47 and in which the active matrix substrate 1002 and the opposing substrate 1003 are laminated together with the liquid crystal layer 30 interposed therebetween may also be referred to as an in-cell touch panel display device.

Figure 10:
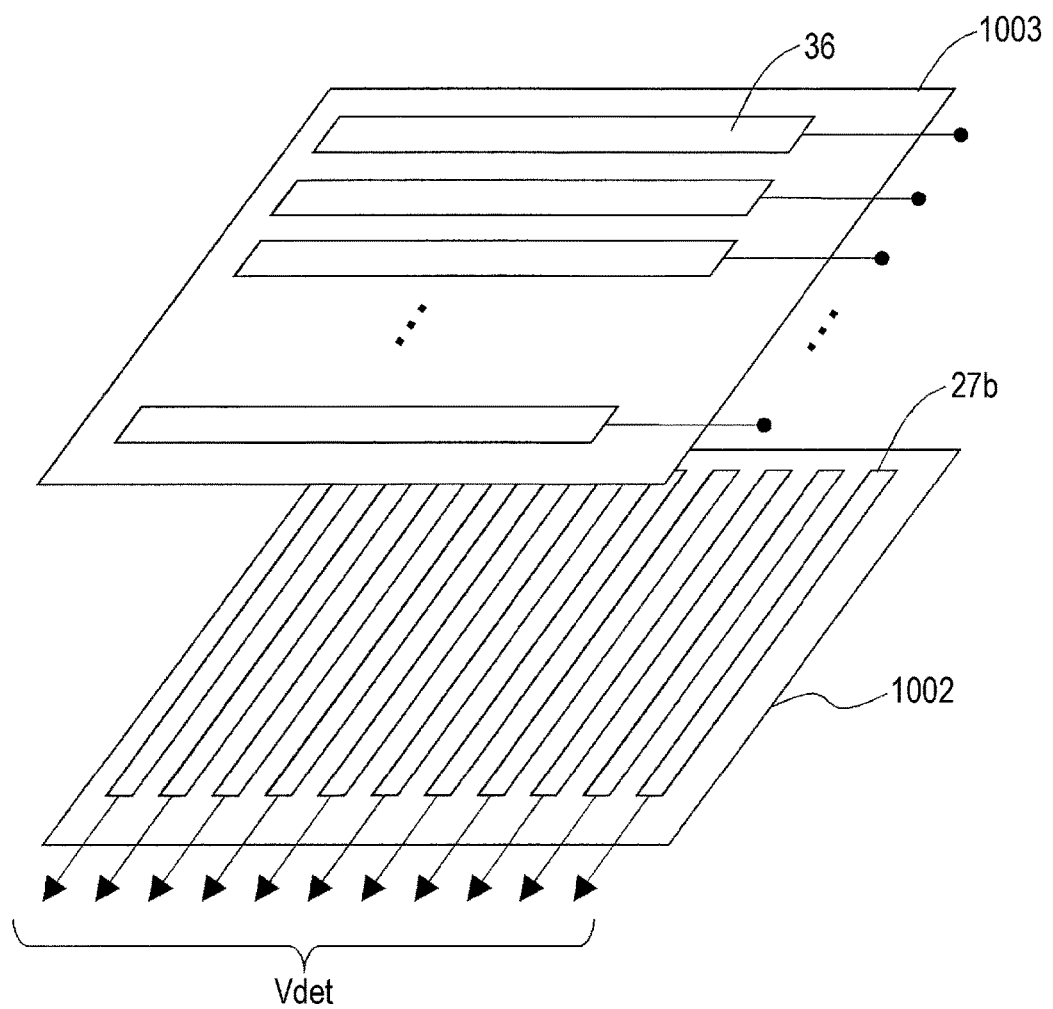
FIG. 10 is a diagram for illustrating the operation of a touch sensor.

Next, a method of detecting a touch will be described with reference to FIG. 10. A touch sensor includes a plurality of drive electrodes 36 disposed on the opposing substrate 1003 and a plurality of first transparent electrodes (detection electrodes) 27b disposed on the active matrix substrate 1002. The plurality of drive electrodes 36 disposed on the opposing substrate 1003 extend in the left and right directions in the figure. When a touch detection operation is performed, a drive signal V1 is sequentially supplied from the drive electrode driver 45 to each of the drive electrodes 36, and scan driving is sequentially performed in a time-division manner. The plurality of detection electrodes 27*b* each extend in a direction orthogonal to the drive electrodes 36 and are each connected to the touch detection unit 47. At intersections of the drive electrodes 36 and the detection electrodes 27*b*, capacitances are generated.

As a result of the supply of the drive signal V1 from the drive electrode driver 45 to the drive electrodes 36, touch detection signals Vdet are outputted from the detection electrodes 275 to the touch detection unit 47 to achieve touch detection. The intersecting electrode pattern is formed in a matrix in the capacitive touch sensor. By scanning over the entire touch detection plane, a touch can be detected and coordinates of the touch position can be specified.

The configuration, the driving method, etc. of an in-cell touch panel display device are disclosed, for example, in International Publication No. 2015/059995 by the present applicant. The entire contents of International Publication. No. 2015/059995 are incorporated herein by reference.

According to this embodiment, the connecting portion 104 having excellent contact properties can be obtained without a complicated production process because the bottom conductive film 4 is formed using a transparent conductive film from which the first transparent electrodes 27*b* are also formed and a conductive film from which the auxiliary wire 20*b* that drives a touch sensor is also formed.

When the liquid crystal display mode is an FFS or IPS mode, the common electrode can be used as a detection electrode of a touch sensor. This allows all the electrodes necessary for touch sensor operation to be disposed in a liquid crystal display device and enables liquid crystal display signals and touch sensor signals to be connected together through a single mounting portion. In other liquid crystal display modes, the first transparent electrode 27*b* may be made to function as a detection electrode, and, for example, the common electrode may be formed on the opposing substrate side.

The active matrix substrate 1002 can be produced by the same method as the method for producing the active matrix substrate 1001 described above with reference to FIG. 4 to FIG. 6, except that, in the step shown in FIG. 5(*c*), after the first transparent conductive film 27 is patterned to form the transparent conductive layer 27*a* and the first transparent electrode 27*b*, a step of forming the auxiliary wire 20*b* and the conductive layer 20*a* is performed before the step of forming the second insulating layer 9. In this step of forming the auxiliary wire 20*b* and the conductive layer 20*a*, a conductive film is formed so as to cover the transparent conductive layer 27*a* and the first transparent electrode 27*b*, and the conductive film is then patterned to obtain the auxiliary wire 20*b* and the conductive layer 20*a*. In the patterning, a resist mask may be used that covers a region where the auxiliary wire 20*b* is to be formed and the bottom of the contact hole 6*p*. The resist mask need not cover the bottom of the contact hole 6*p*. In this case, a portion of the conductive film may be left in the contact hole 6*p* by controlling etching conditions such as etching time and the type of etching gas according to, for example, the diameter and depth of the contact hole 6*p* and the type and thickness of the conductive film. The portion left behind may be used as the conductive layer 20*a* of the bottom conductive film 4.

Third Embodiment

A third embodiment of the semiconductor device according to the present invention will now be described with reference to the drawings. The semiconductor device according to this embodiment is an active matrix substrate including an oxide semiconductor TFT and a crystalline silicon TFT that are formed on a single substrate. The active matrix substrate according to this embodiment can be used for various display devices, for example, an in-cell touch panel display device.

The active matrix substrate includes a TFT (pixel TFT) for each pixel. As the pixel TFT, an oxide semiconductor TFT including an In—Ga—Zn—O-based semiconductor film as an active layer is used, for example.

A peripheral drive circuit may be partially or wholly formed in an integral manner on a substrate on which the pixel TFT is also formed. Such an active matrix substrate is called a driver monolithic active matrix substrate. In the driver monolithic active matrix substrate, the peripheral drive circuit is disposed in a region (non-display region or picture-frame region) other than a region (display region) including a plurality of pixels. As a TFT (circuit TFT) of the peripheral drive circuit, a crystalline silicon TFT including a polycrystalline silicon film as an active layer is used, for example. The use of an oxide semiconductor TFT as the pixel TFT and a crystalline silicon TFT as the circuit TFT enables reduced power consumption in the display region and, moreover, a smaller picture-frame region.

As the pixel TFT, the TFT 201 in the first or second embodiment (e.g., FIG. 3, FIG. 6, or FIG. 9) can be used. This will be described later.

Next, a more specific configuration of the active matrix substrate according to this embodiment will be described with reference to the drawings.

Figure 11:
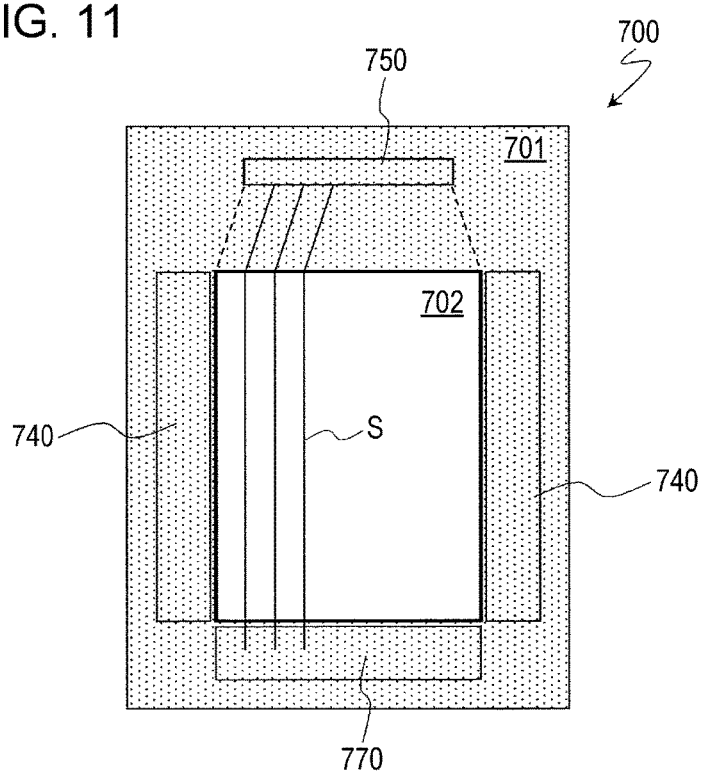
FIG. 11 is a schematic plan view of an exemplary planar structure of an active matrix substrate 700 according to a third embodiment.
Figure 12:
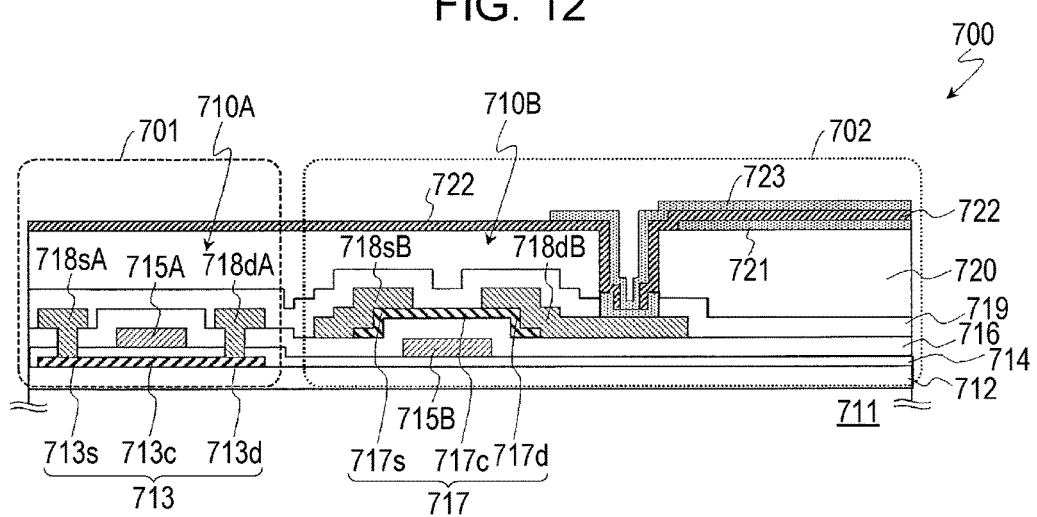
FIG. 12 is a sectional view of a crystalline silicon TFT 710A and an oxide semiconductor TFT 710B in the active matrix substrate 700.
Figure 13:
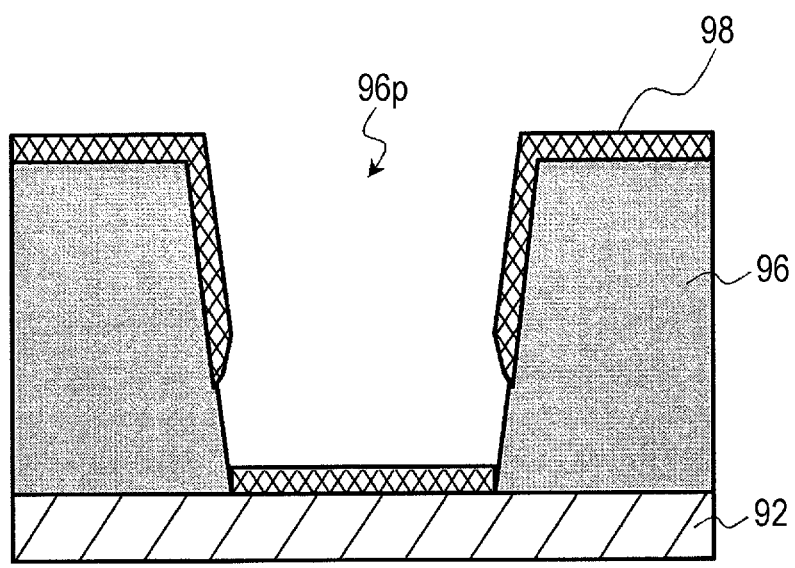
FIG. 13 is a sectional view illustrating a conventional connecting portion.

FIG. 11 is a schematic plan view of an exemplary planar structure of an active matrix substrate 700 according to this embodiment. FIG. 12 is a sectional view of sectional structures of a crystalline silicon TFT (hereinafter referred to as a "first thin film transistor") 710A and an oxide semiconductor TFT (hereinafter referred to as a "second thin film transistor") 710B in the active matrix substrate 700.

As shown in FIG. 11, the active matrix substrate 700 has a display region 702 including a plurality of pixels and a region. (non-display region) other than the display region 702. The non-display region includes a drive-circuit-forming region 701 in which a drive circuit is disposed. For example, a gate driver circuit 740, an inspection circuit 770, etc. are disposed in the drive-circuit-forming region 701. A plurality of gate bus lines (not shown) extending in a row direction and a plurality of source bus lines S extending in a column direction are formed in the display region 702. Although not illustrated, the pixels are defined, for example, by the gate bus lines and the source bus lines S. The gate bus lines are connected to their respective terminals of the gate driver circuit. The source bus lines S are connected to their respective terminals of a driver IC 750 mounted on the active matrix substrate 700.

As shown in FIG. 12, in the active matrix substrate 700, the second thin film transistor 710B, serving as a pixel TFT, is formed for each pixel in the display region 702, and the first thin film transistor 710A, sewing as a circuit TFT, is formed in the drive-circuit-forming region 701.

The active matrix substrate 700 includes a substrate 711, an underlying film 712 formed on a surface of the substrate 711, the first thin film transistor 710A formed on the underlying film 712, and the second thin film transistor 710B formed on the underlying film 712. The first thin film transistor 710A is a crystalline silicon TFT having an active region mainly containing crystalline silicon. The second thin film transistor 710B is an oxide semiconductor TFT having an active region mainly containing an oxide semiconductor. The first thin film transistor 710A and the second thin film transistor 710B are formed integrally with the substrate 711. "Active region" as used herein refers to a region in a semiconductor layer serving as an active layer of a TFT, in which region a channel is formed.

The first thin film transistor 710A includes a crystalline silicon semiconductor layer (e.g., a low-temperature polysilicon layer) 713 formed on the underlying film 712, a first insulating layer 714 that covers the crystalline silicon semiconductor layer 713, and a gate electrode 715A disposed on the first insulating layer 714. In the first insulating layer 714, a portion located between the crystalline silicon semiconductor layer 713 and the gate electrode 715A functions as a gate insulating film of the first thin film transistor 710A. The crystalline silicon semiconductor layer 713 has a channel-forming region (active region) 713c, and a source region 713s and a drain region 713d located on opposite sides of the active region. In this example, the active region 713c is a portion of the crystalline silicon semiconductor layer 713 that overlaps the gate electrode 715A with the first insulating layer 714 interposed therebetween. The first thin film transistor 710A further includes a source electrode 718sA connected to the source region 713s and a drain electrode 718dA connected to the drain region 713d. The source and drain electrodes 718sA and 718dA may be disposed on an interlayer insulating film (a second insulating layer 716 in this case) that covers the gate electrode 715A and the crystalline silicon semiconductor layer 713 and may be connected to the crystalline silicon semiconductor layer 713 in contact holes formed in the interlayer insulating film.

The second thin film transistor 710B includes a gate electrode 715B disposed on the underlying film 712, the second insulating layer 716 that covers the gate electrode 715B, and an oxide semiconductor layer 717 disposed on the second insulating layer 716. As illustrated, the first insulating layer 714, serving as the gate insulating film of the first thin film transistor 710A, may extend to a region in which the second thin film transistor 710B is to be formed. In this case, the oxide semiconductor layer 717 may be formed on the first insulating layer 714. In the second insulating layer 716, a portion located between the gate electrode 715B and the oxide semiconductor layer 717 functions as a gate insulating film of the second thin film transistor 710B. The oxide semiconductor layer 717 has a channel-forming region (active region) 717c, and a source contact region 717s and a drain contact region 717d located on opposite sides of the active region. In this example, the active region 717c is a portion of the oxide semiconductor layer 717 that overlaps the gate electrode 715B with the second insulating layer 716 interposed therebetween. The second thin film transistor 710B further includes a source electrode 718sB connected to the source contact region 717s and a drain electrode 718dB connected to the drain contact region 717d. The underlying film 712 need not be disposed on the substrate 711.

The thin film transistors 710A and 710B are covered with a passivation film 719 and a planarization film 720. In the second thin film transistor 710B, serving as a pixel TFT, the gate electrode 715B is connected to a gate bus line (not shown), the source electrode 718sB is connected to a source bus line (not shown), and the drain electrode 718dB is connected to a pixel electrode 723. In this example, the drain electrode 718dB is connected to the corresponding pixel electrode 723 in an opening formed in the passivation film 719 and the planarization film 720. The connecting portion between the pixel electrode 723 and the drain electrode 718dB has the above configuration described with reference to, for example, FIG. 1 to FIG. 3. A video signal is supplied to the source electrode 718sB through the source bus line, and a necessary charge is written to the pixel electrode 723 in response to a gate signal from the gate bus line.

As illustrated, a transparent conductive layer 721 that serves as a common electrode may be formed on the planarization film 720, and a third insulating layer 722 may be formed between the transparent conductive layer (common electrode) 721 and the pixel electrode 723. In this case, the pixel electrode 723 may be provided with a slit-shaped opening. The active matrix substrate 700 having the above-described configuration can be used, for example, for a fringe field switching (FFS) mode display device. The FFS mode is a lateral electric field mode in which a pair of electrodes is disposed on one substrate and an electric field is applied to liquid crystal molecules in a direction parallel to the substrate surface (the lateral direction). In this example, an electric field represented by a line of electric force that extends from the pixel electrode 723, passes through a liquid crystal layer (not shown) and through the slit-shaped opening of the pixel electrode 723, and reaches the common electrode 721 is generated. This electric field has a component that is lateral with respect to the liquid crystal layer. Therefore, a lateral electric field can be applied to the liquid crystal layer. The lateral electric field mode is advantageous in that liquid crystal molecules do not rise from a substrate and thus a wider viewing angle than in a longitudinal electric field mode can be achieved.

As the second thin film transistor 710B in this embodiment, the TFT 201 in the first or second embodiment can be used. When the TFT 201 in the first or second embodiment is used, the gate electrode 12, the gate insulating layer 14, the oxide semiconductor layer 16, and the source and drain electrodes 18s and 18d in the TFT 201 may correspond to the gate electrode 715B, the second insulating layer (gate insulating layer) 716, the oxide semiconductor layer 717, and the source and drain electrodes 718sB and 718dB, respectively, shown in FIG. 12.

As a TFT (inspection TFT) of the inspection circuit 770 shown in FIG. 11, the thin film transistor 710S, which is an oxide semiconductor TFT, may be used.

Although not illustrated, the inspection TFT and the inspection circuit may be formed, for example, in a region in which the driver IC 750 shown in FIG. 11 is mounted. In this case, the inspection TFT is disposed between the driver IC 750 and the substrate 711.

In the example illustrated, the first thin film transistor 710A has a top-gate structure in which the crystalline silicon semiconductor layer 713 is disposed between the gate electrode 715A and the substrate 711 (the underlying film 712). The second thin film transistor 710B has a bottom-gate structure in which the gate electrode 715B is disposed between the oxide semiconductor layer 717 and the substrate 711 (the underlying film 712). These structures can more effectively suppress the increases in the number of production steps and in production cost in forming the two thin film transistors 710A and 710B integrally on the single substrate 711.

The TFT structures of the first thin film transistor 710A and the second thin film transistor 710B are not limited to the above-described structures. For example, the thin film transistors 710A and 710B may have the same TFT structure. Alternatively, the first thin film transistor 710A may have a bottom-gate structure, and the second thin film transistor 710B may have a top-gate structure. The bottom-gate structure may be a channel etch structure, as in the thin film transistor 710B, or may be an etch stop structure.

The second insulating layer 716, serving as a gate insulating film of the second thin film transistor 710B, may extend to the region in which the first thin film transistor 710A is formed and may function as an interlayer insulating film that covers the gate electrode 715A and the crystalline silicon semiconductor layer 713 of the first thin film transistor 710A. When the interlayer insulating film of the first thin film transistor 710A and the gate insulating film of the second thin film transistor 710B are formed in the same layer (second insulating layer) 716 as described above, the second insulating layer 716 may have a multilayer structure. For example, the second insulating layer 716 may have a multilayer structure including a hydrogen donor layer (e.g., a silicon nitride layer) capable of supplying hydrogen and an oxygen donor layer (e.g., a silicon oxide layer) capable of supplying oxygen and disposed on the hydrogen donor layer.

The gate electrode 715A of the first thin film transistor 710A and the gate electrode 715B of the second thin film transistor 710B may be formed in the same layer. The source and drain electrodes 718sA and 718dA of the first thin film transistor 710A and the source and drain electrodes 718sB and 718dB of the second thin film transistor 710B may be formed in the same layer. "Formed in the same layer" means being formed using the same film (conductive film). This can suppress the increases an the number of production steps and in production cost.

INDUSTRIAL APPLICABILITY

The embodiments of the present invention are widely applicable to various devices including active matrix substrates, for example, liquid crystal display devices, organic electroluminescence (EL) display devices, inorganic electroluminescence display devices, and in-cell touch panel display devices; and devices including thin film transistors, for example, image-capturing devices such as image sensor devices, and electronic devices such as image input devices and fingerprint recognition devices.

REFERENCE SIGNS LIST 2 lower conductive layer
4 bottom conductive film
4e end face of bottom conductive film
4u upper surface of bottom conductive film
4A first layer
4B second layer
4Ae, 4Be end face
6 first insulating layer
6p contact hole
8 upper conductive layer
9 second insulating layer
9p opening
11 substrate
12 gate electrode
14 gate insulating layer
16 oxide semiconductor layer
18d drain electrode
18s source electrode
20a conductive layer
20b auxiliary wire
22 inorganic insulating layer
24 organic insulating layer
27 first transparent conductive film
27a transparent conductive layer
27b first transparent electrode
27p opening
28 second transparent electrode
101, 102, 103, 104 connecting portion.
1001, 1002 active matrix substrate

The invention claimed is:

1. An active matrix substrate comprising a substrate and a connection portion supported by the substrate,
wherein the connecting portion includes:
a lower conductive layer supported by the substrate,
a first insulating layer formed so as to cover the lower conductive layer, the first insulating layer having a plurality of contact holes that exposes a part of the lower conductive layer,
a bottom conductive film that is disposed in the contact hole and covers at least a part of the exposed part of the lower conductive layer, the exposed part being exposed by the contact hole,
a second insulating layer that is formed on the first insulating layer and in the contact hole and that is in contact with the bottom conductive film in the contact hole, the second insulating layer having an opening that exposes a part of the bottom conductive film, and
an upper conductive layer that is disposed on the second insulating layer and in the opening and that is in contact with the bottom conductive film in the opening,
the entire bottom conductive film being located on the substrate side relative to an upper surface of the first insulating layer, and
further comprising a plurality of thin film transistors supported by the substrate; a plurality of first transparent electrodes; and a plurality of second transparent electrodes disposed over the first transparent electrodes with the second insulating layer interposed therebetween,
wherein the lower conductive layer is formed from a conductive film from which a source electrode of the thin film transistor is also formed,
the upper conductive layer is formed from a conductive film from which the second transparent electrode is also formed, and
the bottom conductive film includes a transparent conductive layer formed from a transparent conductive film from which the first transparent electrode is also formed.

2. The active matrix substrate according to claim 1, wherein the second insulating layer is disposed so as to cover the bottom conductive film, at least a part of a side wall of the contact hole, and at least a part of the upper surface of the first insulating layer.

3. The active matrix substrate according to claim 1, wherein the bottom conductive film is disposed so as to cover an area ranging from a bottom to a part of the side wall of the contact hole and has an end face on the side wall of the contact hole, and
the second insulating layer covers the end face of the bottom conductive film.

4. The active matrix substrate according to claim 1, wherein the bottom conductive film includes a metal layer.

5. The active matrix substrate according to claim 1, wherein the bottom conductive film includes a transparent conductive layer.

6. The active matrix substrate according to claim 1, wherein the bottom conductive film has a multilayer structure including a transparent conductive layer and a metal layer.

7. The active matrix substrate according to claim 1, wherein the exposed part of the bottom conductive film, the exposed part being exposed by the opening, has thickness d, as measured in a normal direction of a surface of the substrate, of 50 nm or more.

8. The active matrix substrate according to claim 1, wherein the first insulating layer has a thickness of 1 µm or more and 3 µm or less.

9. The active matrix substrate according to claim 1, wherein the upper surface of the first insulating layer is substantially flat.

10. The active matrix substrate according to claim 1, wherein the first insulating layer includes an organic insulating layer.

11. The active matrix substrate according to claim 1, wherein the bottom conductive film includes a conductive layer formed from a conductive film from which a wire for driving an in-cell touch panel is also formed.

12. A method for producing an active matrix substrate, comprising:
    a step (A) of forming a lower conductive layer on a substrate;
    a first insulating layer forming step (B) of forming a first insulating layer that covers the lower conductive layer, the first insulating layer having a plurality of contact holes that exposes a part of the lower conductive layer;
    a bottom conductive film forming step (C) of forming a bottom conductive film in the contact hole such that the bottom conductive film covers at least a part of the exposed part of the lower conductive layer, the exposed part being exposed by the contact hole, the bottom conductive film having an upper surface located on the substrate side relative to an upper surface of the first insulating layer;
    a second insulating layer forming step (D) of forming a second insulating layer on the first insulating layer and in the contact hole such that the second insulating layer is in contact with the bottom conductive film in the contact hole, the second insulating layer having an opening that exposes at least a part of the bottom conductive film; and
    a step (E) of forming an upper conductive layer on the second insulating layer and in the opening such that the upper conductive layer is in contact with the bottom conductive film in the opening,
    wherein, by these steps, a connecting portion that electrically connects the lower conductive layer and the upper conductive layer to each other is formed, and
    the active matrix substrate further includes a plurality of thin film transistors, a plurality of first transparent electrodes, and a plurality of second transparent electrodes disposed over the first transparent electrodes with the second insulating layer interposed therebetween,
    in the step (A), the lower conductive layer is formed from a conductive film from which a source electrode of the thin film transistor is also formed,
    in the step (C), the bottom conductive film includes a transparent conductive layer, and the transparent conductive layer is formed from a transparent conductive film from which the first transparent electrode is also formed, and
    in the step (E), the upper conductive layer is formed from a conductive film from which the second transparent electrode is also formed.

13. The method of producing an active matrix substrate according to claim 12, wherein the bottom conductive film includes a conductive layer formed from a conductive film from which a wire for driving an in-cell touch panel is also formed.

* * * * *